United States Patent
Ramasamy et al.

(10) Patent No.: US 11,576,288 B2
(45) Date of Patent: *Feb. 7, 2023

(54) SYSTEM AND METHOD FOR ELECTROMAGNETIC INTERFERENCE MITIGATION FOR AN ANTENNA ELEMENT AND SPEAKER CO-LOCATED WITHIN A CAVITY FORMED BEHIND A SPEAKER GRILL

(71) Applicant: Dell Products, LP, Round Rock, TX (US)

(72) Inventors: Suresh K. Ramasamy, Cedar Park, TX (US); Changsoo Kim, Cedar Park, TX (US); Timothy C. Shaw, Austin, TX (US); Geroncio O. Tan, Austin, TX (US)

(73) Assignee: Dell Products, LP, Round Rock, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/461,677

(22) Filed: Aug. 30, 2021

(65) Prior Publication Data

US 2021/0392800 A1 Dec. 16, 2021

Related U.S. Application Data

(63) Continuation of application No. 16/777,893, filed on Jan. 31, 2020, now Pat. No. 11,116,117.

(51) Int. Cl.
*G06F 1/16* (2006.01)
*H05K 9/00* (2006.01)
*H01Q 1/22* (2006.01)

(52) U.S. Cl.
CPC ......... *H05K 9/0088* (2013.01); *G06F 1/1656* (2013.01); *H01Q 1/2266* (2013.01); *H05K 9/0009* (2013.01); *H05K 9/0015* (2013.01)

(58) Field of Classification Search
CPC .. H05K 9/0088; H05K 9/0009; H05K 9/0015; H05K 9/006; G06F 1/1656;
(Continued)

(56) References Cited

U.S. PATENT DOCUMENTS 5,522,602 A 6/1996 Kaplo
8,170,266 B2 5/2012 Hopkinson
(Continued)

*Primary Examiner* — Abhishek M Rathod
*Assistant Examiner* — Keith DePew
(74) *Attorney, Agent, or Firm* — Prol Intellectual Property Law, PLLC; H. Kenneth Prol

(57) ABSTRACT

An information handling system to wirelessly transmit and receive data may include a base chassis including a metal C-cover and metal D-cover to house a processor, a memory, and a wireless adapter, the metal C-cover to house a speaker grill, the speaker grill covering a speaker to emit audio waves; the speaker grill formed within the C-cover to emit a target radio frequency (RF) including a slot formed around a portion of the speaker grill forming a peninsula on the speaker grill that is physically separated from the C-cover; an antenna element placed behind the speaker grill and operatively coupled to the wireless adapter; an electromagnetic interference (EMI) shield forming a cavity enclosing the speaker and the antenna element, including a plurality of metallic shielding walls extending from the C-cover to a D-cover of the information handling system; and a conductive rubber gasket placed between the plurality of conductive walls and the D-cover to shield the cavity from EMI sources.

20 Claims, 15 Drawing Sheets

(58) Field of Classification Search
CPC .... G06F 1/1616; G06F 1/1688; G06F 1/1698; H01Q 1/2266; H01Q 1/526
See application file for complete search history.

(56) References Cited

U.S. PATENT DOCUMENTS

| | | |
|---|---|---|
| 8,665,160 B2 | 3/2014 | Uttermann |
| 8,803,745 B2 | 8/2014 | Dabov |
| 8,907,229 B2 | 12/2014 | Park |
| 8,963,782 B2 | 2/2015 | Ayala Vazquez |
| 9,444,131 B2 | 9/2016 | Uttermann |
| 9,766,662 B2 | 9/2017 | Smith |
| 10,396,431 B2 | 8/2019 | Ramasamy |
| 10,476,136 B2 | 11/2019 | Mow |
| 10,658,744 B2 | 5/2020 | Uttermann |
| 10,862,190 B1 | 12/2020 | Ramasamy |
| 10,938,113 B1 | 3/2021 | Kim |
| 10,992,027 B2 | 4/2021 | Yamamoto |
| 2010/0092022 A1 | 4/2010 | Hopkinson |
| 2011/0151780 A1 | 6/2011 | Hood |
| 2012/0194393 A1 | 8/2012 | Uttermann |
| 2013/0016870 A1 | 1/2013 | Chen |
| 2013/0094126 A1 | 4/2013 | Rappoport |
| 2013/0207851 A1 | 8/2013 | Dabov |
| 2014/0086441 A1 | 3/2014 | Zhu |
| 2014/0185857 A1 | 7/2014 | Uttermann |
| 2016/0380333 A1 | 12/2016 | Utterman |
| 2017/0288295 A1 | 10/2017 | Sultenfuss |
| 2018/0026341 A1 | 1/2018 | Mow |
| 2019/0027808 A1 | 1/2019 | Mow |
| 2019/0220067 A1 | 7/2019 | Sugiura |
| 2019/0237848 A1 | 8/2019 | Ramasamy |
| 2020/0243947 A1 | 7/2020 | Yamamoto |
| 2021/0126345 A1 | 4/2021 | Zoo |
| 2021/0175610 A1 | 6/2021 | Ramasamy |

SYSTEM AND METHOD FOR ELECTROMAGNETIC INTERFERENCE MITIGATION FOR AN ANTENNA ELEMENT AND SPEAKER CO-LOCATED WITHIN A CAVITY FORMED BEHIND A SPEAKER GRILL

This application is a continuation of prior application Ser. No. 16/777,893, entitled "SYSTEM AND METHOD FOR ELECTROMAGNETIC INTERFERENCE MITIGATION FOR AN ANTENNA ELEMENT AND SPEAKER CO-LOCATED WITHIN A CAVITY FORMED BEHIND A SPEAKER GRILL," filed on Jan. 31, 2020, which is assigned to the current assignee hereof and is incorporated herein by reference in its entirety.

FIELD OF THE DISCLOSURE

The present disclosure generally relates to information handling systems, and more particularly relates to electromagnetic interreference (EMI) mitigation for an information handling system including an antenna system co-located with a speaker within a cavity formed behind a speaker grill.

BACKGROUND

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

For purposes of this disclosure, an information handling system may include any instrumentality or aggregate of instrumentalities operable to compute, calculate, determine, classify, process, transmit, receive, retrieve, originate, switch, store, display, communicate, manifest, detect, record, reproduce, handle, or utilize any form of information, intelligence, or data for business, scientific, control, or other purposes. For example, an information handling system may be a personal computer (e.g., desktop or laptop), tablet computer, mobile device (e.g., personal digital assistant (PDA) or smart phone), server (e.g., blade server or rack server), a network storage device, or any other suitable device and may vary in size, shape, performance, functionality, and price. The information handling system may include random access memory (RAM), one or more processing resources such as a central processing unit (CPU) or hardware or software control logic, read-only memory (ROM), and/or other types of nonvolatile memory. Additional components of the information handling system may include one or more disk drives, one or more network ports for communicating with external devices as well as various input and output (I/O) devices, such as a keyboard, a mouse, touchscreen and/or a video display. The information handling system may also include one or more buses operable to transmit communications between the various hardware components. The information handling system may also include telecommunication, network communication, and video communication capabilities. The information handling system may also include one or more buses operable to transmit communications between the various hardware components. The information handling system may also include telecommunication, network communication, and video communication capabilities. Information handling system chassis parts may include case portions such as for a laptop information handling system including the C-cover over components designed with a metal structure. The information handling system may be configurable with an antenna system co-located with a speaker and within a cavity of a C-cover chassis.

BRIEF DESCRIPTION OF THE DRAWINGS

It will be appreciated that for simplicity and clarity of illustration, elements illustrated in the Figures are not necessarily drawn to scale. For example, the dimensions of some elements may be exaggerated relative to other elements. Embodiments incorporating teachings of the present disclosure are shown and described with respect to the drawings herein, in which.

The use of the same reference symbols in different drawings may indicate similar or identical items.

DETAILED DESCRIPTION OF THE DRAWINGS

Figure 1:
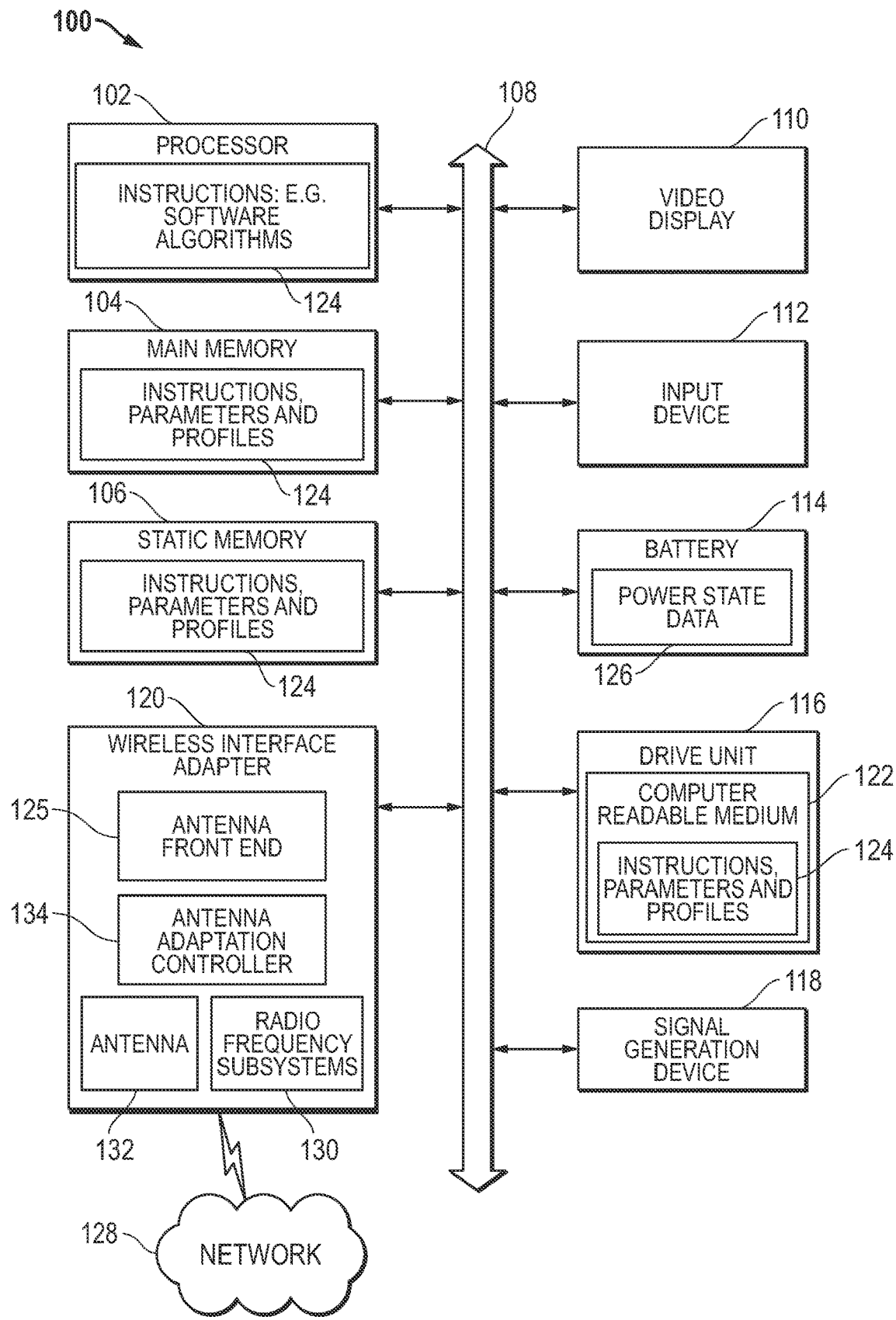
FIG. 1 illustrates an embodiment of information handling system according to an embodiment of the present disclosure.

The following description in combination with the Figures is provided to assist in understanding the teachings disclosed herein. The description is focused on specific implementations and embodiments of the teachings, and is provided to assist in describing the teachings. This focus should not be interpreted as a limitation on the scope or applicability of the teachings.

For aesthetic, strength, and performance reasons, information handling system chassis parts are more commonly designed with a metal structure. In an embodiment, a laptop information handling system, for example, may include a plurality of covers for the interior components of the information handling system forming a base housing and a display housing. In these embodiments, a form factor case may include an "A-cover" which serves as a back cover for a display housing and a "B-cover" which may serve as the bezel, if any, and a display screen of the convertible laptop information handling system in an embodiment. In a further example, the laptop information handling system case may include a "C-cover" housing a keyboard, touchpad, speaker grill, and any cover in which these components are set and a "D-cover" base housing for the laptop information handling system.

With the need for utility of lighter, thinner, and more streamlined devices, the use of full metal portions for the outer covers of the display and base housing (e.g. the A-cover and the D-cover) is desirable for strength as well as aesthetic reasons. At the same time, the demands for wireless operation also increase. This includes addition of many simultaneously operating radiofrequency (RF) systems, addition of more antennas, and utilization of various antenna types operating at various and different frequencies. However, the thinner and more streamlined devices have fewer locations and area available for mounting RF transmitters on these mobile information handling systems. One location within the information handling system where these RF systems and antennas are being pushed out of are the A-cover and B-covers. The RF systems and antennas are being pushed out of the A-cover and B-covers as a result, in one example, of the increased sizes of displays. This may lead to placing the RF systems and antennas in the C-cover or D-cover of the information handling systems.

Another consequence of using metal covers is the excitation of the metal surfaces of the covers described herein. This excitation of the metal surfaces leads to destructive interference in the signals sent by the antenna systems. This destructive interference may be relatively more detrimental when the RF systems and antennas are emitting signals with radio frequencies associated with the 5G standard related frequencies that may reach into microwave length frequencies and are, therefore, more susceptible to such interference. Thus, a streamlined, full metal chassis capable of meeting the increasing wireless operation demands is needed.

Some information handling systems would address these competing needs by providing for cutout portions of a metal outer chassis cover filled with plastic behind which RF transmitters/receivers would be mounted. The cutouts to accommodate radio frequency (RF) transmitters/receivers are often located in aesthetically undesirable locations and required additional plastic components to cover the cutout, thus not fully meeting the streamlining needs. The plastic components added a component to be manufactured and were required to be seamlessly integrated into an otherwise smooth metal chassis cover to achieve a level of aesthetics. Further, the plastic portions included may be expensive to machine, and may require intricate multi-step processes for integrating the metal and plastic parts into a single chassis. Incorporation of these plastic portions, therefore, could require more parts or difficult and expensive processes to manufacture with a less aesthetically desirable result. Other options included, for aperture type antenna transmitters, the creation of an aperture in the metal display panel chassis and using the metal chassis as a ground plane for excitation of the aperture.

Embodiments of the present disclosure may decrease the complexity and cost of creating chassis for information handling systems by forming the outer chassis (e.g. the A-cover or the D-cover) of metal and implementing a speaker grill that has a portion of its perimeter that has been physically and operatively disassociated from the C-cover. In some embodiments described herein, a cavity is formed behind a speaker grill and is acoustically and electrically insulated to increase the abilities of the speaker and an antenna element placed in or operatively coupled with that cavity. The co-location of an antenna with the speaker grill and speaker therein thereby decreases the size of the information handling system while providing additional space for other components of the information handling system. In a specific embodiment, the placement of the antenna element behind the speaker grill or use of the speaker grill as an antenna and at a location by a speaker provides for additional space at the B-cover to expand the size of any video display device of the information handling system or allows more antennas deployed such as for 5G systems. This increases the usability and functionality of the information handling system.

Additionally, with the advent of different numbers of RF antenna systems such as Wi-Fi 5G, 4G, and NFC, among others, interference between the myriad of different RF transmissions may be realized especially within a metallic chassis housing electronically actuated elements that emit electromagnetic waves either directly or through excitation of the metallic chassis. Embodiments of the present disclosure, therefor, include an electromagnetic interference (EMI) shield in the form of a number of walls placed between the C-cover and D-cover to form a cavity around the speaker and antenna systems. This minimizes the foot print of the audio and antenna systems associated with the speaker grill while also minimizing the effect on the antenna by shielding the antenna system from outside EMI.

In an embodiment of the present disclosure, the cavity may also include a plastic audio insert that further defines an audio cavity within the cavity formed by the walls. This allows for greater flexibility with regards to the selection of speaker such that a myriad of types of speakers may have their audio output enhanced by the use of the plastic audio insert placed within the cavity while providing a known cavity size for the selected speaker type. Because the plastic audio insert is made of a material that is transparent to RF transmissions, the transceiving activity of the antenna within the cavity as well as any resonances within the cavity may cause unwanted EMI or may be affected by outside EMI.

In an embodiment of the present disclosure, the cavity may have a conductive rubber gasket that hermetically seals the metallic walls formed around the speaker grill to create the cavity. The conductive rubber gaskets may seal the audio cavity relative to the speaker and conductively seal the cavity relative to the antenna. In an embodiment, the conductive rubber gasket and metallic walls may serve as a grounding path to a grounding source for the antenna and any EMI originating outside of the cavity formed by the metallic walls. As a result, of the incorporation of the speaker and antenna into the cavity, any double wall structures that may separate the speaker and antenna systems from each other may be eliminated thereby decreasing the overall size of the information handling system. This provides for the information handling system to be thinner and lighter thereby increasing the aesthetics and functionality of the information handling system thereby increasing user satisfaction. Still further, in some embodiments, irregular shaped antenna structures may be placed within the cavity that now has an increased amount of volume as a result of the speaker and antenna being co-located within the cavity. The cavity also serves to both acoustically isolate the speaker while concurrently isolating the cavity from EMI.

Manufacture of embodiments of the present disclosure may involve fewer extraneous parts than previous chassis by forming the exterior or outer portions of the information handling system, including the bottom portion of the D-cover and the top portion of the A-cover, from metal. In order to allow for manufacture of fully or nearly fully metallic outer chassis including the A-cover and the D-cover, embodiments of the present disclosure form a form factor case enclosing the information handling system such that one or more transmitting antennas within the speaker grill integrated into the C-cover of the information handling system. In these embodiments, the footprint within the information handling system the antenna system consumes may be reduced and a single cavity used for audio output by the speaker grill and speaker may also serve as a location where the antenna system is located and RF EM signals may be emitted.

Such a method of placing the antenna element at the speaker grill of the form factor case may exclude the integration of any RF transparent plastic windows elsewhere within the exterior of the A-cover, B-cover, C-cover, or the D-cover, thus decreasing the complexity and cost of manufacture. In other embodiments, a plastic trim ring may be used to visually hide a slot formed around the speaker grill increasing the aesthetic characteristics of the information handling system. In this embodiment, a portion of the speaker grill separated from C-cover may be excited by an excitation current causing the portion of the speaker grill to act as an antenna element. In this embodiment, the plastic trim ring may hide the existence of the slot.

In some embodiments presented herein, the size of the cavity formed behind the speaker grill may be defined by overlaying non-metallic portions of the C-cover with a metallic overlay instead of forming metallic walls that extend from the C-cover to the D-cover (or alternatively from the D-cover to the C-cover). In an embodiment, the non-metallic portion of the C-cover includes the plastic audio insert used to enhance the audio characteristics of the speaker. Extension of the continuous metallic walls with metallic overlay on non-conductive surfaces to define the cavity still allows for EMI isolation within the cavity as well as acoustic enhancement and isolation for the speaker. Additionally, the metallic overlay may increase the ability to tune metallic gaps within the C-cover without hard tooling changes during the manufacturing process. Targeted frequencies may also be achieved by varying the size of the cavity via use of the metallic overlays. Thus, the co-location of the speaker with the antenna within the cavity as described herein may provide increased flexibility as to which frequencies are optimally emitted from the information handling system thereby increasing the usability of the information handling system.

Examples are set forth below with respect to particular aspects of an information handling system including case portions such as for a laptop information handling system including the chassis components designed with a fully metal structure and configurable such that the information handling system may operate in any of several usage mode configurations.

FIG. 1 shows an information handling system 100 capable of administering each of the specific embodiments of the present disclosure. The information handling system 100, in an embodiment, can represent the mobile information handling systems 210, 220, and 230 or servers or systems located anywhere within network 200 described in connection with FIG. 2 herein, including the remote data centers operating virtual machine applications. Information handling system 100 may represent a mobile information handling system associated with a user or recipient of intended wireless communication. A mobile information handling system may execute instructions via a processor such as a microcontroller unit (MCU) operating both firmware instructions or hardwired instructions for the antenna adaptation controller 134 to achieve WLAN or WWAN antenna optimization under various protocols according to embodiments disclosed herein. The application programs operating on the information handling system 100 may communicate or otherwise operate via concurrent wireless links, individual wireless links, or combinations over any available radio access technology (RAT) protocols including WLAN and WWAN protocols. These application programs may operate in some example embodiments as software, in whole or in part, on an information handling system while other portions of the software applications may operate on remote server systems. The antenna adaptation controller 134 of the presently disclosed embodiments may operate as firmware or hardwired circuitry or any combination on controllers or processors within the information handing system 100 for interface with components of a wireless interface adapter 120. It is understood that some aspects of the antenna adaptation controller 134 described herein may interface or operate as software or via other controllers associated with the wireless interface adapter 120 or elsewhere within information handling system 100. In an embodiment, the antenna adaptation controller 134 may control an amount of current at a voltage to be sent to an antenna element co-located with a speaker placed behind a speaker grill and within a cavity formed within the C-cover of the information handling system as described herein. The antenna adaptation controller 134 may, in the embodiments presented herein, be operatively coupled to the antenna element 132 of the speaker grill or placed under the speaker grill to excite the antenna element and dynamically switch frequencies based on a target frequency or frequencies to be emitted by the antenna element 132. In order to switch between frequencies to be emitted from the antenna element, the antenna adaptation controller 134 may include circuitry used to alter the current and voltage applied to the antenna element. The antenna adaptation controller 134 may alter the current and voltage in order to alter the ratio of impedance to capacitive reactance at the antenna element, thereby altering the frequencies emitted by the antenna element 132. In an embodiment presented herein, the antenna adaptation controller 134 may form part of the wireless interface adapter 120 along with the antenna front end 125.

Information handling system 100 may also represent a networked server or other system from which some software applications are administered or which wireless communications such as across WLAN or WWAN may be conducted. In other aspects, networked servers or systems may operate the antenna adaptation controller 134 for use with a wireless interface adapter 120 on those devices similar to embodiments for WLAN or WWAN antenna optimization operation according to according to various embodiments.

The information handling system 100 may include a processor 102 such as a central processing unit (CPU), a graphics processing unit (GPU), or both. Moreover, the information handling system 100 can include a main memory 104 and a static memory 106 that can communicate with each other via a bus 108. As shown, the information handling system 100 may further include a video display unit 110, such as a liquid crystal display (LCD), an organic light emitting diode (OLED), a flat panel display, or a solid-state display. Display 110 may include a touch screen display module and touch screen controller (not shown) for receiving user inputs to the information handling system 100. Touch screen display module may detect touch or proximity to a display screen by detecting capacitance changes in the display screen. Additionally, the information handling system 100 may include an input device 112, such as a keyboard, and a cursor control device, such as a mouse or touchpad or similar peripheral input device. The information handling system may include a power source such as battery 114 or an A/C power source. The information handling system 100 can also include a disk drive unit 116, and a signal generation device 118, such as a speaker or remote control. The information handling system 100 can include a network interface device such as a wireless adapter 120. The information handling system 100 can also represent a server device whose resources can be shared by multiple client devices, or it can represent an individual client device, such as a desktop personal computer, a laptop computer, a tablet computer, a wearable computing device, or a mobile smart phone.

Signal generation device 118, such as a speaker, may be mounted to a speaker grill in a chassis of the information handling system as described in various embodiments herein. A speaker may be operatively connected to an audio driver system to broadcast audio signals and content for the information handling system. The information handling system 100 includes an audio system that includes the speaker placed behind the speaker grill. The speaker may be any device that receives a signal from the processor 102 and produces audio as input to the user. This output may be any type of audio including music and notification sounds. As described herein, the speaker may be co-located with the antenna system in order to decrease the footprint of the speaker and antenna systems consumed within the information handling system 100. In some embodiments presented herein, the antennas 132 include the speaker grill which is excited by an excitation signal from the antenna front end 125 that causes a signal to be emitted from the speaker grill. In some embodiments presented herein, the antennas 132 include an antenna element placed behind speaker grill which is excited by an excitation signal from the antenna front end 125 that causes a signal to be emitted from behind the speaker grill. Accordingly, the present disclosure describes, in some embodiments, the antenna front end 125 may be co-located with a speaker system of which is, in some embodiments, also under the speaker grill.

The information handling system 100 can include sets of instructions 124 that can be executed to cause the computer system to perform any one or more desired applications. In many aspects, sets of instructions 124 may implement wireless communications via one or more antennas 132 available on information handling system 100. In embodiments presented herein, the sets of instructions 124 may implement wireless communications via one or more antennas 132 formed as part of a speaker grill formed within a C-cover of a laptop-type information handling system. Operation of WLAN and WWAN wireless communications may be enhanced or otherwise improved via WLAN or WWAN antenna operation adjustments via the methods or controller-based functions relating to the antenna adaptation controller 134 disclosed herein. For example, instructions or a controller may execute software or firmware applications or algorithms which utilize one or more wireless links for wireless communications via the wireless interface adapter as well as other aspects or components. The antenna adaptation controller 134 may execute instructions as disclosed herein for monitoring wireless link state information, information handling system configuration data, SAR proximity sensor detection, or other input data to generate channel estimation and determine antenna radiation patterns. In the embodiments presented herein, the antenna adaptation controller 134 may execute instructions as disclosed herein to transmit a communications signal from an antenna system formed behind or as part of a speaker grill. In the embodiment where the antenna 132 forms part of the speaker grill, the speaker grill is excited to resonant a target frequency at a slot formed around a portion of the speaker grill in order to transmit an electromagnetic wave at the target frequency or harmonics thereof. The term "antenna element" 132 or "antenna" 132 described herein is meant to be understood as any object that emits a RF (RF) electromagnetic (EM) wave therefrom and the present disclosure contemplates that a portion of the speaker grill may resonant itself or a separate antenna element 132 may be placed behind the speaker grill to resonate. The antenna element may form part of a larger wireless antenna system that may include some or all of the elements of the wireless interface adapter 120.

Additionally, the antennas 132 in the cavity system of the disclosed embodiments may prevent noise sourced from within or outside the cavity formed around the speaker grill from creating interference with the determined frequency, or harmonics thereof. In some embodiments presented herein, the antenna adaptation controller 134 may also execute instructions as disclosed herein to adjust, via a parasitic coupling element, the directionality and/or pattern of the emitted RF signals from the antenna 132.

The antenna adaptation controller 134 may implement adjustments to wireless antenna systems and resources via a radio frequency integrated circuit (RFIC) front end 125 and WLAN or WWAN radio module systems within the wireless interface device 120. Aspects of the antenna optimization for the antenna adaptation controller 134 may be included as part of an antenna front end 125 in some aspects or may be included with other aspects of the wireless interface device 120 such as WLAN radio module such as part of the radio frequency (RF) subsystems 130. The antenna adaptation controller 134 described in the present disclosure and operating as firmware or hardware (or in some parts software) may remedy or adjust one or more of a plurality of antennas 132 via selecting power adjustments and adjustments to an antenna adaptation network to modify antenna radiation patterns emitted by the speaker grill or other antenna element and parasitic coupling element operations.

Multiple WLAN or WWAN antenna systems that include the speaker grill may operate on various communication frequency bands such as under IEEE 802.11a and IEEE 802.11g (i.e., medium frequency (MF) band, high frequency (HF) band, very high frequency (VHF) band, ultra-high frequency (UHF) band, L band, S band, C band, X band, $K_u$ band, K band, $K_a$ band, V band, W band, and millimeter wave bands) providing multiple band options for frequency channels. Further antenna radiation patterns and selection of antenna options or power levels may be adapted due physical proximity of other antenna systems, of a user with potential SAR exposure, or improvement of RF channel operation according to received signal strength indicator (RSSI), signal to noise ratio (SNR), bit error rate (BER), modulation and coding scheme index values (MCS), or data throughput indications among other factors. In some aspects WLAN or WWAN antenna adaptation controller may execute firmware algorithms or hardware to regulate operation of the one or more antennas 132 such as WLAN or WWAN antennas in the information handling system 100 to avoid poor wireless link performance due to poor reception, poor MCS levels of data bandwidth available, or poor indication of throughput due to indications of low RSSI, low power levels available (such as due to SAR), inefficient radiation patterns among other potential effects on wireless link channels used.

Various software modules comprising software application instructions 124 or firmware instructions may be coordinated by an operating system (OS) and via an application programming interface (API). An example operating system may include Windows®, Android®, and other OS types known in the art. Example APIs may include Win 32®, Core Java® API, Android® APIs, or wireless adapter driver API. In a further example, processor 102 may conduct processing of mobile information handling system applications by the information handling system 100 according to the systems and methods disclosed herein which may utilize wireless communications. The computer system 100 may operate as a standalone device or may be connected such as using a network, to other computer systems or peripheral devices. In other aspects, additional processor or control logic may be implemented in graphical processor units (GPUs) or controllers located with radio modules or within a wireless adapter 120 to implement method embodiments of the antenna adaptation controller and antenna optimization according to embodiments herein. Code instructions 124 in firmware, hardware or some combination may be executed to implement operations of the antenna adaptation controller and antenna optimization on control logic or processor systems within the wireless adapter 120 for example.

In a networked deployment, the information handling system 100 may operate in the capacity of a server or as a client user computer in a server-client user network environment, or as a peer computer system in a peer-to-peer (or distributed) network environment. The information handling system 100 can also be implemented as or incorporated into various devices, such as a personal computer (PC), a tablet PC, a set-top box (STB), a PDA, a mobile information handling system, a tablet computer, a laptop computer, a desktop computer, a communications device, a wireless smart phone, wearable computing devices, a control system, a camera, a scanner, a printer, a personal trusted device, a web appliance, a network router, switch or bridge, or any other machine capable of executing a set of instructions (sequential or otherwise) that specify actions to be taken by that machine. In a particular embodiment, the computer system 100 can be implemented using electronic devices that provide voice, video or data communication. Further, while a single information handling system 100 is illustrated, the term "system" shall also be taken to include any collection of systems or sub-systems that individually or jointly execute a set, or multiple sets, of instructions to perform one or more computer functions.

The disk drive unit 116 may include a computer-readable medium 122 in which one or more sets of instructions 124 such as software can be embedded. Similarly, main memory 104 and static memory 106 may also contain computer-readable medium for storage of one or more sets of instructions, parameters, or profiles 124. The disk drive unit 116 and static memory 106 also contains space for data storage. Some memory or storage may reside in the wireless adapter 120. Further, the instructions 124 that embody one or more of the methods or logic as described herein. For example, instructions relating to the antenna adaptation system or antenna adjustments described in embodiments herein may be stored here or transmitted to local memory located with the antenna adaptation controller 134, antenna front end 125, or wireless module in RF subsystem 130 in the wireless interface adapter 120.

In a particular embodiment, the instructions, parameters, and profiles 124 may reside completely, or at least partially, within a memory, such as non-volatile static memory, during execution of antenna adaptation by the antenna adaptation controller 134 in wireless interface adapter 120 of information handling system 100. As explained, some or all of the antenna adaptation and antenna optimization may be executed locally at the antenna adaptation controller 134, RF front end 125, or wireless module subsystem 130. Some aspects may operate remotely among those portions of the wireless interface adapter or with the main memory 104 and the processor 102 in parts including the computer-readable media in some embodiments.

Battery 114 may be operatively coupled to a power management unit that tracks and provides power stat data 126. This power state data 126 may be stored with the instructions, parameters, and profiles 124 to be used with the systems and methods disclosed herein in determining WLAN antenna adaptation and antenna optimization in some embodiments.

The network interface device shown as wireless adapter 120 can provide connectivity to a network 128, e.g., a wide area network (WAN), a local area network (LAN), wireless local area network (WLAN), a wireless personal area network (WPAN), a wireless wide area network (WWAN), or other network. Connectivity may be via wired or wireless connection. Wireless adapter 120 may include one or more RF subsystems 130 with transmitter/receiver circuitry, modem circuitry, one or more antenna front end circuits 125, one or more wireless controller circuits such as antenna adaptation controller 134, amplifiers, antennas 132 and other radio frequency (RF) subsystem circuitry 130 for wireless communications via multiple radio access technologies. Each RF subsystem 130 may communicate with one or more wireless technology protocols. The RF subsystem 130 may contain individual subscriber identity module (SIM) profiles for each technology service provider and their available protocols for subscriber-based radio access technologies such as cellular LTE communications. The wireless adapter 120 may also include antennas 132 which may be tunable antenna systems or may include an antenna adaptation network for use with the system and methods disclosed herein to optimize antenna system operation. Additional antenna system adaptation network circuitry (not shown) may also be included with the wireless interface adapter 120 to implement WLAN or WWAN modification measures as described in various embodiments of the present disclosure.

In some aspects of the present disclosure, a wireless adapter 120 may operate two or more wireless links. In a further aspect, the wireless adapter 120 may operate the two or more wireless links with a single, shared communication frequency band such as with the Wi-Fi WLAN operation or 5G LTE standard WWAN operations in an example aspect. For example, a 5 GHz wireless communication frequency band may be apportioned under the 5G standards for communication on either small cell WWAN wireless link operation or Wi-Fi WLAN operation as well as other wireless activity in LTE, WiFi, WiGig, Bluetooth, or other communication protocols. 5G standards may be defined by the download speeds and the operation under any FR1 or FR2 frequencies. In the embodiments presented herein, the 5G standard operable by the antenna systems may interface with other 5G technology within the network and may include systems and subsystems that enable beamforming and signal relay processes associated with a 5G architecture. In some embodiments, the shared, wireless communication bands may be transmitted through one or a plurality of antennas. In an embodiment, the shared, wireless communication bands may be transmitted through one or a plurality of antennas 132 some of which may be co-located with a plurality of speaker grills as described herein. Other communication frequency bands are contemplated for use with the embodiments of the present disclosure as well.

In other aspects, the information handling system 100 operating as a mobile information handling system may operate a plurality of wireless adapters 120 for concurrent radio operation in one or more wireless communication bands. The plurality of wireless adapters 120 may further operate in nearby wireless communication bands in some disclosed embodiments. Further, harmonics, environmental wireless conditions, and other effects may impact wireless link operation when a plurality of wireless links are operating as in some of the presently described embodiments. The series of potential effects on wireless link operation may cause an assessment of the wireless adapters 120 to potentially make antenna system adjustments according to the WLAN antenna adaptation control system of the present disclosure. Further, embodiments of antennas 132 described herein may co-locate the antennas 132 in a cavity formed behind a speaker grill at the C-cover of an information handling system. Embodiments herein describe a system design to minimize the impact of multiple wireless links operating concurrently in such systems.

The wireless adapter 120 may operate in accordance with any wireless data communication standards. To communicate with a wireless local area network, standards including IEEE 802.11 WLAN standards, IEEE 802.15 WPAN standards, WWAN such as 3GPP or 3GPP2, or similar wireless standards may be used. Wireless adapter 120 and antenna adaptation controller 134 may connect to any combination of macro-cellular wireless connections including 2G, 2.5G, 3G, 4G, 5G or the like from one or more service providers. Utilization of RF communication bands according to several example embodiments of the present disclosure may include bands used with the WLAN standards and WWAN carriers which may operate in both license and unlicensed spectrums. For example, both WLAN and WWAN may use the Unlicensed National Information Infrastructure (U-NII) band which typically operates in the ~5 MHz frequency band such as 802.11 a/h/j/n/ac (e.g., center frequencies between 5.170-5.785 GHz). It is understood that any number of available channels may be available under the 5 GHz shared communication frequency band in example embodiments. WLAN, for example, may also operate at a 2.4 GHz band. WWAN may operate in a number of bands, some of which are propriety but may include a wireless communication frequency band at approximately 2.5 GHz band for example. In additional examples, WWAN carrier licensed bands may operate at frequency bands of approximately 700 MHz, 800 MHz, 1900 MHz, or 1700/2100 MHz for example as well. In the example embodiment, mobile information handling system 100 includes both unlicensed wireless RF communication capabilities as well as licensed wireless RF communication capabilities. For example, licensed wireless RF communication capabilities may be available via a subscriber carrier wireless service. With the licensed wireless RF communication capability, WWAN RF front end may operate on a licensed WWAN wireless radio with authorization for subscriber access to a wireless service provider on a carrier licensed frequency band.

The wireless adapter 120 can represent an add-in card, wireless network interface module that is integrated with a main board of the information handling system or integrated with another wireless network interface capability, or any combination thereof. In an embodiment the wireless adapter 120 may include one or more RF subsystems 130 including transmitters and wireless controllers such as wireless module subsystems for connecting via a multitude of wireless links under a variety of protocols. In an example embodiment, an information handling system may have an antenna 132 transmitter for 5G small cell WWAN, Wi-Fi WLAN or WiGig connectivity and one or more additional antenna 132 transmitters for macro-cellular communication. The RF subsystems 130 include wireless controllers to manage authentication, connectivity, communications, power levels for transmission, buffering, error correction, baseband processing, and other functions of the wireless adapter 120.

The RF subsystems 130 of the wireless adapters may also measure various metrics relating to wireless communication pursuant to operation of an antenna system as in the present disclosure. For example, the wireless controller of a RF subsystem 130 may manage detecting and measuring received signal strength levels, bit error rates, signal to noise ratios, latencies, power delay profile, delay spread, and other metrics relating to signal quality and strength. Such detected and measured aspects of wireless links, such as links operating on one or more antennas 132, may be used by the antenna adaptation controller to adapt the antennas 132 according to an antenna adaptation network according to various embodiments herein. In one embodiment, a wireless controller of a wireless interface adapter 120 may manage one or more RF subsystems 130. The wireless controller also manages transmission power levels which directly affect RF subsystem power consumption as well as transmission power levels from the plurality of antennas 132. The transmission power levels from the antennas 132 may be relevant to specific absorption rate (SAR) safety limitations for transmitting mobile information handling systems. To control and measure power consumption via a RF subsystem 130, the RF subsystem 130 may control and measure current and voltage power that is directed to operate one or more antennas 132.

The wireless network may have a wireless mesh architecture in accordance with mesh networks described by the wireless data communications standards or similar standards in some embodiments but not necessarily in all embodiments. The wireless adapter 120 may also connect to the external network via a WPAN, WLAN, WWAN or similar wireless switched Ethernet connection. The wireless data communication standards set forth protocols for communications and routing via access points, as well as protocols for a variety of other operations. Other operations may include handoff of client devices moving between nodes, self-organizing of routing operations, or self-healing architectures in case of interruption.

In some embodiments, software, firmware, dedicated hardware implementations such as application specific integrated circuits, programmable logic arrays and other hardware devices can be constructed to implement one or more of the methods described herein. Applications that may include the apparatus and systems of various embodiments can broadly include a variety of electronic and computer systems. One or more embodiments described herein may implement functions using two or more specific interconnected hardware modules or devices with related control and data signals that can be communicated between and through the modules, or as portions of an application-specific integrated circuit. Accordingly, the present system encompasses software, firmware, and hardware implementations.

In accordance with various embodiments of the present disclosure, the methods described herein may be implemented by firmware or software programs executable by a controller or a processor system. Further, in an exemplary, non-limited embodiment, implementations can include distributed processing, component/object distributed processing, and parallel processing. Alternatively, virtual computer system processing can be constructed to implement one or more of the methods or functionalities as described herein.

The present disclosure contemplates a computer-readable medium that includes instructions, parameters, and profiles 124 or receives and executes instructions, parameters, and profiles 124 responsive to a propagated signal; so that a device connected to a network 128 can communicate voice, video or data over the network 128. Further, the instructions 124 may be transmitted or received over the network 128 via the network interface device or wireless adapter 120.

Information handling system 100 includes one or more application programs 124, and Basic Input/Output System and firmware (BIOS/FW) code 124. BIOS/FW code 124 functions to initialize information handling system 100 on power up, to launch an operating system, and to manage input and output interactions between the operating system and the other elements of information handling system 100. In a particular embodiment, BIOS/FW code 124 reside in memory 104, and include machine-executable code that is executed by processor 102 to perform various functions of information handling system 100. In another embodiment (not illustrated), application programs and BIOS/FW code reside in another storage medium of information handling system 100. For example, application programs and BIOS/FW code can reside in drive 116, in a ROM (not illustrated) associated with information handling system 100, in an option-ROM (not illustrated) associated with various devices of information handling system 100, in storage system 107, in a storage system (not illustrated) associated with network channel of a wireless adapter 120, in another storage medium of information handling system 100, or a combination thereof. Application programs 124 and BIOS/FW code 124 can each be implemented as single programs, or as separate programs carrying out the various features as described herein.

While the computer-readable medium is shown to be a single medium, the term "computer-readable medium" includes a single medium or multiple media, such as a centralized or distributed database, and/or associated caches and servers that store one or more sets of instructions. The term "computer-readable medium" shall also include any medium that is capable of storing, encoding, or carrying a set of instructions for execution by a processor or that cause a computer system to perform any one or more of the methods or operations disclosed herein.

In a particular non-limiting, exemplary embodiment, the computer-readable medium can include a solid-state memory such as a memory card or other package that houses one or more non-volatile read-only memories. Further, the computer-readable medium can be a random-access memory or other volatile re-writable memory. Additionally, the computer-readable medium can include a magneto-optical or optical medium, such as a disk or tapes or other storage device to store information received via carrier wave signals such as a signal communicated over a transmission medium. Furthermore, a computer readable medium can store information received from distributed network resources such as from a cloud-based environment. A digital file attachment to an e-mail or other self-contained information archive or set of archives may be considered a distribution medium that is equivalent to a tangible storage medium. Accordingly, the disclosure is considered to include any one or more of a computer-readable medium or a distribution medium and other equivalents and successor media, in which data or instructions may be stored.

Figure 2:
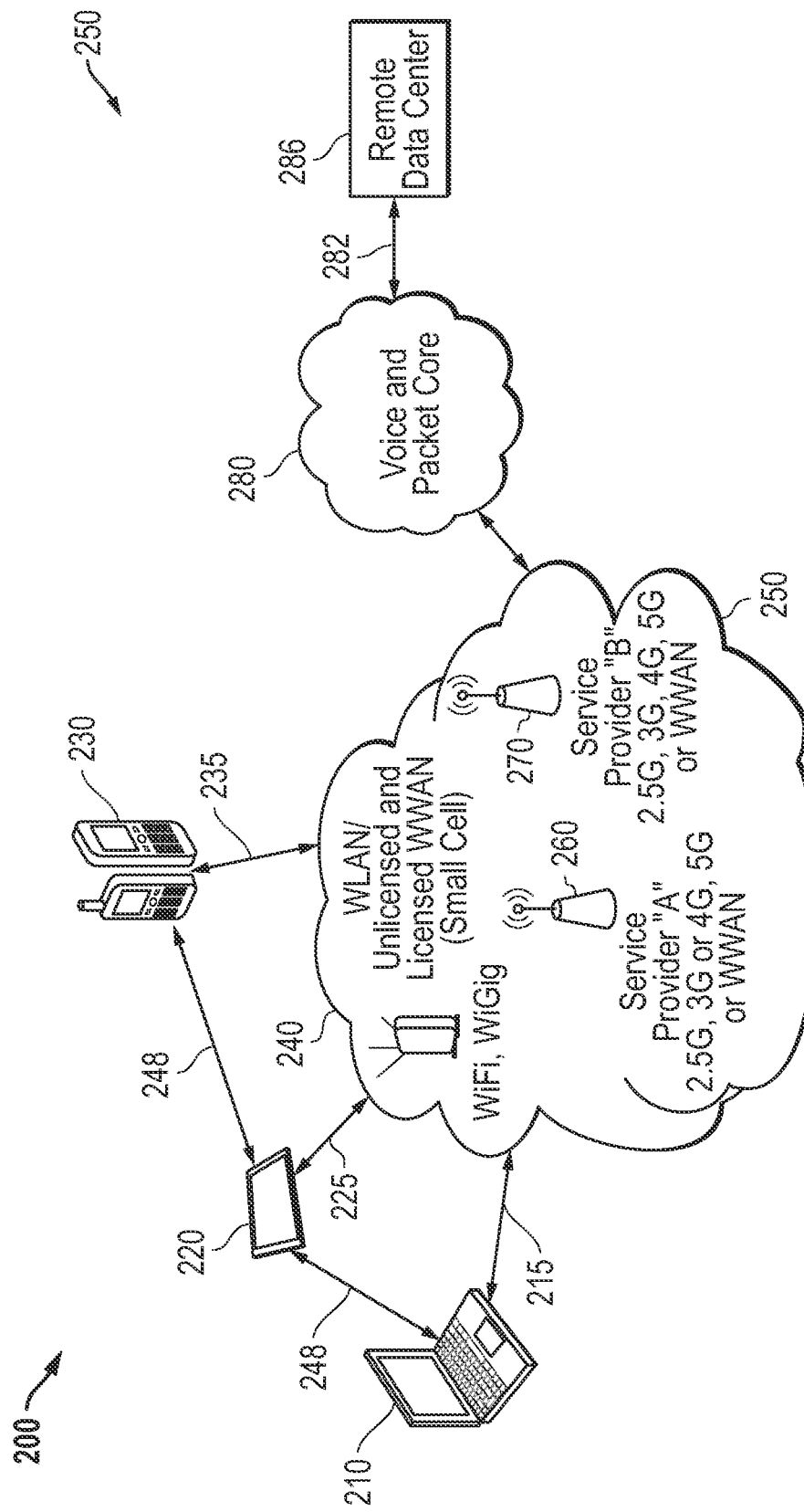
FIG. 2 is a block diagram of a network environment offering several communication protocol options and mobile information handling systems according to an embodiment of the present disclosure.

FIG. 2 illustrates a network 200 that can include one or more information handling systems 210, 220, 230. In a particular embodiment, network 200 includes networked mobile information handling systems 210, 220, and 230, wireless network access points, and multiple wireless connection link options. A variety of additional computing resources of network 200 may include client mobile information handling systems, data processing servers, network storage devices, local and wide area networks, or other resources as needed or desired. As partially depicted, systems 210, 220, and 230 may be a laptop computer, tablet computer, 360-degree convertible systems, wearable computing devices, or a smart phone device. These mobile information handling systems 210, 220, and 230, may access a wireless local network 240, or they may access a macro-cellular network 250. For example, the wireless local network 240 may be the wireless local area network (WLAN), a wireless personal area network (WPAN), or a wireless wide area network (WWAN). In an example embodiment, LTE-LAA WWAN may operate with a small-cell WWAN wireless access point option. In an embodiment, the mobile information handling systems 210, 220, and 230, may access one or more of a metro-cell networks, a micro-cell networks, a pico-cell networks, a femto-cell networks or combinations thereof within a 5G cellular network. In this embodiment, the mobile information handling systems 210, 220, 230 as operated as a 5G cellular network may operate in a 24 GHz range or above.

Since WPAN or Wi-Fi Direct Connection 248 and WWAN networks can functionally operate similar to WLANs, they may be considered as wireless local area networks (WLANs) for purposes herein. Components of a WLAN may be connected by wireline or Ethernet connections to a wider external network. For example, wireless network access points may be connected to a wireless network controller and an Ethernet switch. Wireless communications across wireless local network 240 may be via standard protocols such as IEEE 802.11 Wi-Fi, IEEE 802.11ad WiGig, IEEE 802.15 WPAN, IEEE 802.11, IEEE 1914/1904, IEEE P2413/1471/42010, or emerging 5G small cell WWAN communications such as eNodeB, or similar wireless network protocols developed for 5G communications. Alternatively, other available wireless links within network 200 may include macro-cellular connections 250 via one or more service providers 260 and 270. Service provider macro-cellular connections may include 2G standards such as GSM, 2.5G standards such as GSM EDGE and GPRS, 3G standards such as W-CDMA/UMTS and CDMA 2000, 4G standards, or emerging 5G standards including WiMAX, LTE, and LTE Advanced, LTE-LAA, small cell WWAN, and the like.

Wireless local network 240 and macro-cellular network 250 may include a variety of licensed, unlicensed or shared communication frequency bands as well as a variety of wireless protocol technologies ranging from those operating in macrocells, small cells, picocells, or femtocells.

In some embodiments according to the present disclosure, a networked mobile information handling system 210, 220, or 230 may have a plurality of wireless network interface systems capable of transmitting simultaneously within a shared communication frequency band. That communication within a shared communication frequency band may be sourced from different protocols on parallel wireless network interface systems or from a single wireless network interface system capable of transmitting and receiving from multiple protocols. Similarly, a single antenna or plural antennas may be used on each of the wireless communication devices. Example competing protocols may be local wireless network access protocols such as Wi-Fi/WLAN, WiGig, and small cell WWAN in an unlicensed, shared communication frequency band. Example communication frequency bands may include unlicensed 5 GHz frequency bands or 3.5 GHz conditional shared communication frequency bands under FCC Part 96. Wi-Fi industrial, scientific and medical (ISM) frequency bands that may be subject to sharing include 2.4 GHz, 60 GHz, 900 MHz or similar bands as understood by those of skill in the art. Within local portion of wireless network 250 access points for Wi-Fi or WiGig as well as small cell WWAN connectivity may be available in emerging 5G technology. This may create situations where a plurality of antenna systems are operating on a mobile information handling system 210, 220 or 230 via concurrent communication wireless links on both WLAN and WWAN and which may operate within the same, adjacent, or otherwise interfering communication frequency bands. The antenna may be a transmitting antenna that includes high-band, medium-band, low-band, and unlicensed band transmitting antennas. Alternatively, embodiments may include a single transceiving antennas capable of receiving and transmitting, and/or more than one transceiving antennas. Each of the antennas included in the information handling system 100 in an embodiment may be subject to the FCC regulations related to specific absorption rate (SAR) standards. The antenna in some embodiments described herein may include an aperture antenna (i.e., a cavity-backed dynamic tunable aperture antenna system) intended for efficient use of space within a metal chassis of an information handling system. Other embodiments of the present disclosure may include surfaces or planar wire systems operating as wireless antennas employed in previous information handling systems.

The voice and packet core network 280 may contain externally accessible computing resources and connect to a remote data center 286. The voice and packet core network 280 may contain multiple intermediate web servers or other locations with accessible data (not shown). The voice and packet core network 280 may also connect to other wireless networks similar to 240 or 250 (i.e., a 5G metro-, micro-, pico-, and femto-cell) and additional mobile information handling systems such as 210, 220, 230 or similar connected to those additional wireless networks. Connection 282 between the wireless network 240 and remote data center 286 or connection to other additional wireless networks may be via Ethernet or another similar connection to the worldwide-web, a WAN, a LAN, another WLAN, or other network structure. Such a connection 282 may be made via a WLAN access point/Ethernet switch to the external network and be a backhaul connection. The access point may be connected to one or more wireless access points in the WLAN before connecting directly to a mobile information handling system or may connect directly to one or more mobile information handling systems 210, 220, and 230. Alternatively, mobile information handling systems 210, 220, and 230 may connect to the external network via base station locations at service providers such as 260 and 270. These service provider locations may be network connected via backhaul connectivity through the voice and packet core network 280.

Remote data centers may include web servers or resources within a cloud environment that operate via the voice and packet core 280 or other wider internet connectivity. For example, remote data centers can include additional information handling systems, data processing servers, network storage devices, local and wide area networks, or other resources as needed or desired. Having such remote capabilities may permit fewer resources to be maintained at the mobile information handling systems 210, 220, and 230 allowing streamlining and efficiency within those devices. Similarly, remote data center permits fewer resources to be maintained in other parts of network 200.

Although 215, 225, and 235 are shown connecting wireless adapters of mobile information handling systems 210, 220, and 230 to wireless networks 240 or 250, a variety of wireless links are contemplated. Wireless communication may link through a wireless access point (Wi-Fi or WiGig), through unlicensed WWAN small cell base stations such as in network 240 or through a service provider tower such as that shown with service provider A 260 or service provider B 270 and in network 250. In other aspects, mobile information handling systems 210, 220, and 230 may communicate intra-device via 248 when one or more of the mobile information handling systems 210, 220, and 230 are set to act as an access point or even potentially an WWAN connection via small cell communication on licensed or unlicensed WWAN connections. For example, one of mobile information handling systems 210, 220, and 230 may serve as a Wi-Fi hotspot in an embodiment. Concurrent wireless links to information handling systems 210, 220, and 230 may be connected via any access points including other mobile information handling systems as illustrated in FIG. 2.

Figure 3A:
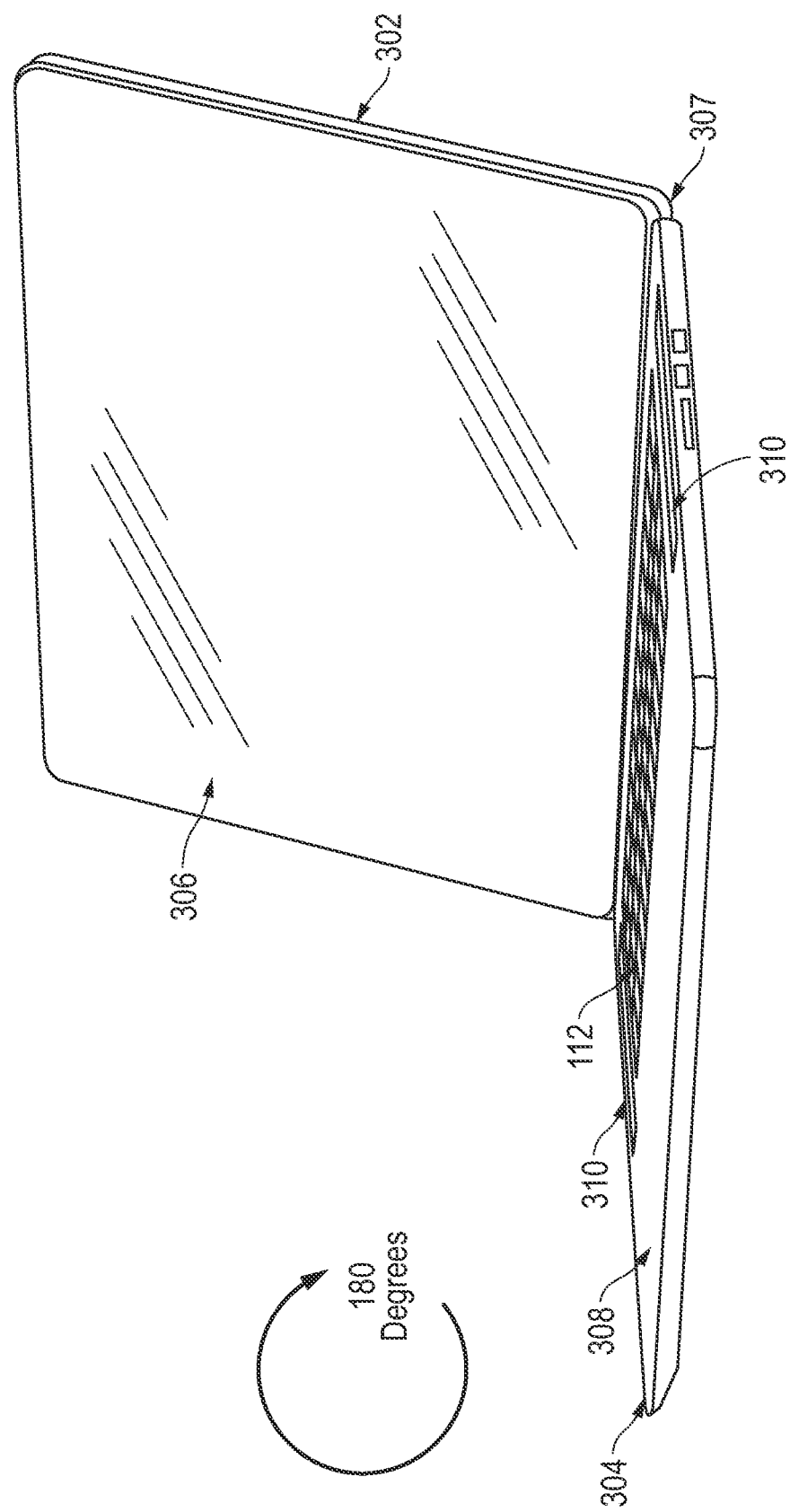
FIG. 3A is a graphical illustration of an information handling system placed in an open configuration with a of C-cover including a speaker grill according to an embodiment of the present disclosure.

FIG. 3A is a graphical illustration of a metal chassis including a base chassis and display chassis placed in an open configuration according to an embodiment of the present disclosure. The open configuration is shown for illustration purposes. It is understood that a closed configuration would have the lid chassis fully closed onto the base chassis. The metal chassis 300 in an embodiment may comprise an outer metal case or shell of an information handling system such as a tablet device, laptop, or other mobile information handling system. As shown in FIG. 3A, the metal chassis 300, in an embodiment, may further include a plurality of chassis or cases. For example, the metal chassis 300 may further include an A-cover 302 functioning to enclose a portion of the information handling system. Metal chassis 300 may further include a B-cover 306. In an embodiment, the B-cover 306 may include a bezel with a display formed therein. In some embodiments, the B-cover 306 may include a display device without a bezel. As another example, the metal chassis 300, in an embodiment, may further include a D-cover 304 functioning to enclose another portion of the information handling system along with a C-cover 308 which may include a transmitting/receiving antenna according to the embodiments described herein. The C-cover 308 may include, for example, a keyboard, a trackpad, or other input/output (I/O) device. When placed in the closed configuration, the A-cover 302 forms a top outer protective shell, or a portion of a lid for the information handling system, while the D-cover 304 forms a bottom outer protective shell, or a portion of a base. When in the fully closed configuration, the A-cover 302 and the D-cover 304 would be substantially parallel to one another.

In some embodiments, both the A-cover 302 and the D-cover 304 may be comprised entirely of metal. In some embodiments, the A-cover 302 and D-cover 304 may include both metallic and plastic components. For example, plastic components that are radio-frequency (RF) transparent may be used to form a portion of the C-cover 308 where a speaker grill 310 interfaces with the C-cover 308. According to the embodiments of the present disclosure, the speaker grill 310 may be formed as a part of the C-cover. In these embodiments, the speaker grill 310 may be formed within the C-cover 308 by forming a speaker grill 310 for a speaker grill platform.

In some embodiments described herein, a portion of the speaker grill 310 may be physically separated from the C-cover 308 by forming a slot around a portion of the speaker grill 310. In some embodiments described herein, the length of the slot around the portion of the speaker grill 310 may be dependent on a target frequency or frequencies to be emitted upon excitation of the speaker grill 310 by, for example, a tuning module or other RF excitation device. In the present disclosure and in the appended claims, the term "portion" is meant to be understood as a part of a whole. Therefore, in the embodiments disclosed herein, the slot formed around the speaker grill 310 may be less than a total cut-out of the speaker grill 310 from the C-cover 308. Some portion of the speaker grill may be framed by a trench in the C-cover.

In the embodiments described herein, the speaker grill 310 may be an integral part of the C-cover 308. In these embodiments, the speaker grill 310 may also be used to cover or protect a speaker placed below the C-cover 308 and speaker grill 310 in order to provide audio output to a user of the information handling system. In some embodiments, the formation of the antenna system that incorporates the speaker grill 310 as the excitation object allows for the removal of the antenna system from the A-cover 302 and B-cover 306. Consequently, the space within the A-cover 302/B-cover 306 assembly where an antenna may have been placed may be eliminated allowing for a relatively larger video display device placed therein. Additionally, the space within the A-cover 302/B-cover 306 assembly where an antenna has been placed in conjunction with the space behind or at the speaker grill for an antenna also provides for additional antennas to be included within the information handling system. As a result of placing the antenna element within the C-cover 308 as part of the speaker grill 310, the capabilities of information handling system may be increased while also increasing user satisfaction during use. In other embodiments, an antenna element may be placed below the speaker grill allowing the antenna element to be co-located with the speaker.

In an embodiment, the speaker grill 310 may be formed at any location on the C-cover 308. Therefore, although FIG. 3A shows two speaker grills 310 located to the left and right of a keyboard 112, the present disclosure contemplates that the speaker grill 310 or speaker grills 310 may be formed along any surface of the C-cover 308. In these embodiments, each of the individual speaker grills 310 may be excited to emit an RF EM wave signal at different frequencies allowing for the ability of the information handling system to communicate on a variety of RATs or individual antenna elements housed behind the speaker grills may be excited to emit an RF EM wave signal at different frequencies allowing for the ability of the information handling system to communicate on a variety of RATs. The present embodiments also contemplate that other antennas may be deployed elsewhere on the information handling system including in a display chassis, base chassis, or a hinge placed between the display chassis and base chassis. Thus, in the embodiments described herein, multiple antenna systems or elements may be concurrently operated by the information handling system so as to allow for the transmission of multiple, different RF signals.

In an embodiment, the A-cover 302 may be movably connected to a back edge of the D-cover 304 via one or more hinges 307. In this configuration shown in FIG. 3A the hinges allow the A-cover 302 to rotate from and to the D-cover 304 allowing for multiple orientations of the information handling system as described herein. In an embodiment, the information handling system may include a sensor to detect the orientation of the information handling system and activate or deactivate any of a number of antenna systems associated with the speaker grill 310 based on the occurrence of any specific orientation.

Figure 3B:
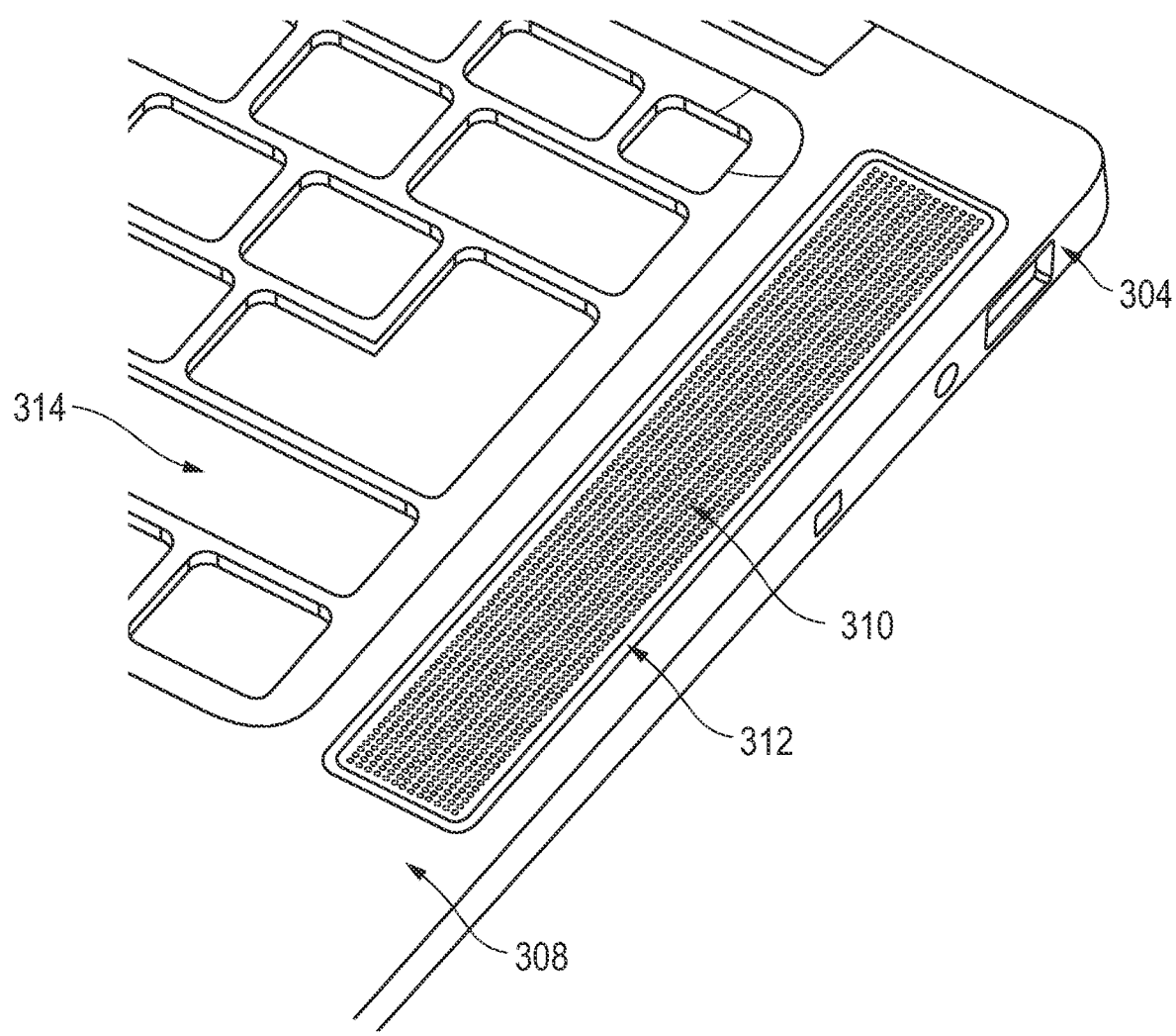
FIG. 3B is a perspective graphical illustration of a C-cover and speaker grill of an information handling system according to an embodiment of the present disclosure.

FIG. 3B is a perspective graphical illustration of a C-cover 308 and speaker grill 310 of an information handling system according to an embodiment of the present disclosure. FIG. 3B shows the C-cover 308 without portions of an underlying D-cover 304 or the keyboard 112 as described in connection with FIG. 3A. In an embodiment a side wall of the information handling system may be a portion of the D-cover 304 and in a separate embodiment, the side wall may be a portion of the C-cover 308. The D-cover 304 and keyboard 112 have been removed for ease of illustration and the present disclosure contemplates that, during assembly, the D-cover 304 and keyboard 112 along with other components of the information handling system are to be assembled together with the C-cover 308 and its speaker grill 310.

The C-cover 308 may include a number of vias 314 through which keys of a keyboard may be placed. Additionally, the C-cover 308 may include a speaker grill 310. The speaker grill 310, as described herein, may serve a plurality of functions. A first function may include a physical barrier between the user and a speaker positioned below the speaker grill 310 and C-cover 308. This speaker may receive input from a processor and provide output (i.e., music and notification sounds) to a user during operation of the information handling system. As a physical carrier, the speaker grill 310 may prevent a user from touching and damaging the speaker as well as other delicate elements placed below the C-cover 308. In an embodiment, the speaker grill 310 may include a number of holes through which sound waves from the speaker may pass.

A second function of the speaker grill 310, in some embodiments, is to house an antenna element that is used to propagate RF EM waves. In this embodiment, the RF waves may be passed through the speaker grill and away from the information handling system.

In other embodiments described herein, the speaker grill 310 may have a slot formed around a portion of the circumference of the speaker grill 310. The slot may be cut between the speaker grill 310 and the C-cover 308 using any type of manufacturing process including laser ablation, electroforming, anisotropic etching, photolithography, or any other type of precision fabrication processing. In this embodiment, the slot may be formed along one edge of the speaker grill 310 or along multiple edges of the speaker grill 310. In specific embodiments, the slot may be formed around a first edge of the speaker grill 310, wrap around to a second edge of the speaker grill 310, and continue onto terminate along a third edge of the speaker grill 310. In this specific embodiment, the slot may make a U-shaped slot around the perimeter of some portion of the speaker grill 310 to form a portion of the speaker grill into a speaker grill platform. Upon excitation of the speaker grill, an RF wave may be propagated along the edges of the speaker grill where the slot is formed.

In order to prevent physical access by objects or the user below the C-cover 308, the speaker grill 310 includes a plastic trim ring 312 placed within the formed slot. In one embodiment, the plastic trim ring 312 may be placed around a portion of the speaker grill 310. In another example, the plastic trim ring 312 may be placed along an entirety of the perimeter of the speaker grill 310. In either embodiment, the plastic trim ring 312 formed around the speaker grill 310 may be formed to lie flush with the speaker grill 310, the C-cover 308, or both. Placing the plastic trim ring 312 flush with the speaker grill 310, the C-cover 308, or both may render the information handling system aesthetically appealing while also preventing objects from passing through the C-cover 308 via the slot. Still further, because the plastic trim ring 312 is made of a RF transparent material (i.e., plastic), RF EM wave emissions from the antenna element or the portion of the speaker grill may still be allowed to propagate from the speaker grill 310 and information handling system without being blocked by an RF non-transparent material. In any embodiment described herein, the color of the plastic trim ring 312 may be chosen to match the color of the C-cover 308 so as to hide the existence of the plastic trim ring 312 thereby increasing the aesthetics of the information handling system.

Although FIG. 3B shows a single speaker grill 310 speaker grill 310 formed into the C-cover 308, the present disclosure contemplates that any number of speaker grills 310 may be formed into the C-cover 308. Additionally, although the present disclosure, in some embodiments, may describe the antenna system as including the excitation of the speaker grill via application of a current to the speaker grill in order to radiate the speaker grill and emit an RF signal, the present disclosure also contemplates embodiments that includes a stand-alone antenna element placed below the speaker grill co-located with the speaker that is excited to emit RF signals. Also, antennas located elsewhere on the information handling system are contemplated with the embodiments described herein. Thus, in FIGS. 3A-3E, the present disclosure contemplates that the radiating elements may be one or both of the speaker grill or a stand-alone antenna element placed below the speaker grill.

In the embodiment shown in FIG. 3B, the length and width of the slot formed along the perimeter of the speaker grill 310 may be distinguished from slots associated with other speaker grills 310 so as to alter the band of RF EM waves capable of being emitted from that specific speaker grill 310. Consequently, the information handling system may include multiple speaker grills 310 capable of transmitting data at multiple RF bands consecutively or concurrently. This increases the communication capabilities of the information handling system such that, in some embodiments, the information handling system can communicate via LTE, WiFi, WiGig, Bluetooth, or other communication protocols based on the frequency band emitted by the individual antenna elements with the speaker grills. Thus, according to the embodiments presented herein, the antenna systems being incorporated into the speaker grill 310 allows for flexibility in the type of antenna being formed at the speaker grill 310 thereby increasing the ability for a user to, during purchase, determine how the information handling system is to communicate with a wireless infrastructure by selecting which RF EM frequency band is going to be used for these communications. Additionally, placement of each of the speaker grills 310 or the speaker grill 310 shown in FIG. 3B may be anywhere on the surface of the C-cover 308 with the slot cut out around a portion of the perimeter of the speaker grill 310 on the C-cover 308. Also, by incorporating the antenna system described herein behind the speaker grill 310 allows for more compact and streamlined information handling system thereby adding to the aesthetics of the information handling system.

In an embodiment presented herein, the plastic trim ring 312 may be maintained within the slot formed around the speaker grill 310 via an undercut. The undercut may be formed so as to prevent the plastic trim ring 312 from being removed vertically from the slot formed. As described herein, because the slot is not formed completely around the speaker grill 310, a portion of the perimeter of the speaker grill 310 may have a trench formed around the perimeter that does not cut entirely through the C-cover 308 as the slot does. In this embodiment, the trench may also include an undercut that prevents the plastic trim ring 312 from being removed vertically (i.e., perpendicular to the surface of the C-cover 308) from the C-cover 308 thereby exposing the trench and slot as described herein.

Figure 3C:
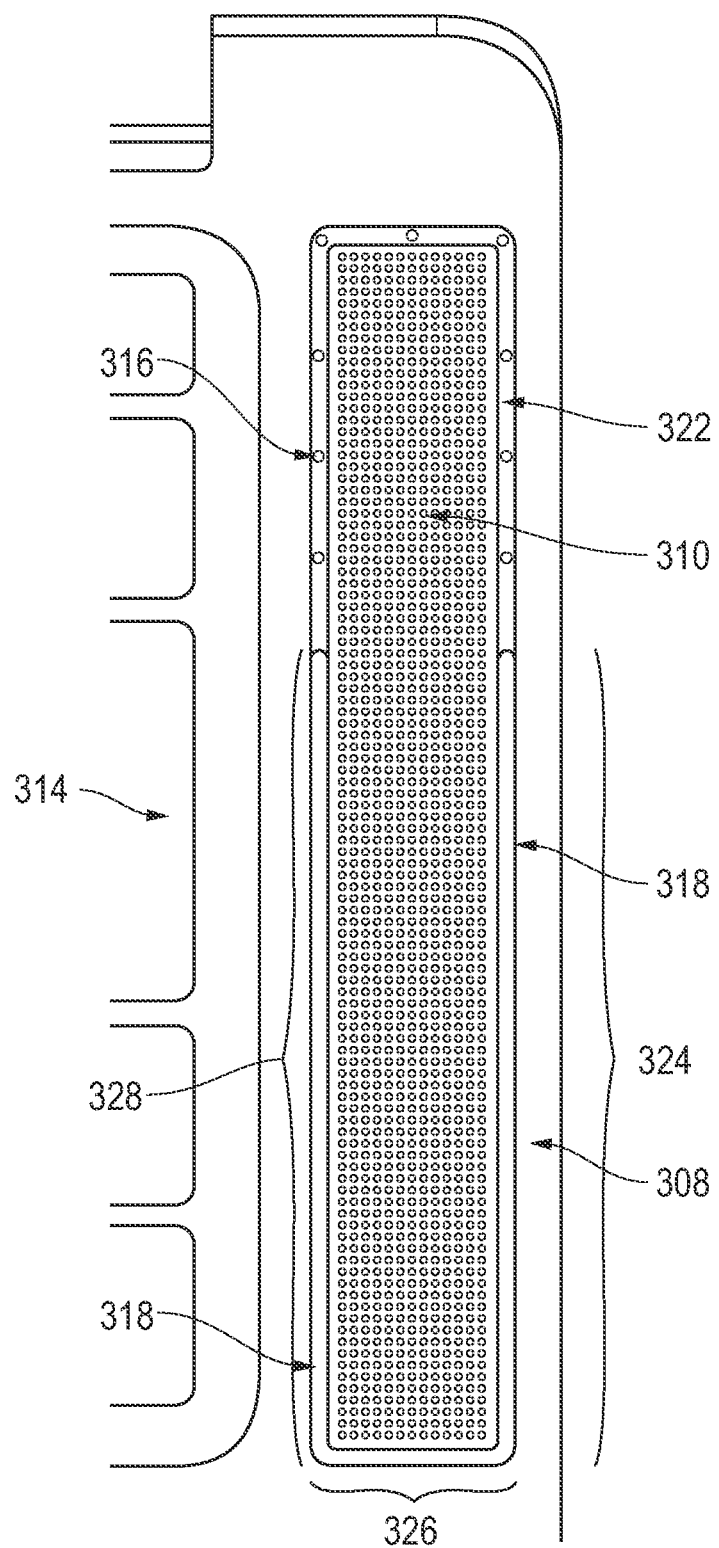
FIG. 3C is another graphical illustration of the C-cover and speaker grill of an information handling system according to an embodiment of the present disclosure.

FIG. 3C is another graphical illustration of the C-cover 308 and speaker grill 310 of an information handling system shown in FIG. 3B according to an embodiment of the present disclosure. As shown in FIG. 3C, the speaker grill 310 has the plastic trim ring 312 removed from the slot 318 and trench 322. A distinguishing characteristic between the slot 318 and the trench 322 is that the slot 318 has been cut entirely through the C-cover 308. In some embodiments, slot 318 formed around speaker grill 310 may create a speaker grill platform antenna that may be excited by an underside contact point. As described herein, the length of the slot 318 around the speaker grill 310 may be selected to size the speaker grill platform antenna based on the frequency bands to be emitted by a platform antenna when the speaker grill 310 is excited by the tuning module or other type of excitation circuitry. All remaining portions of the perimeter of the speaker grill 310 may have a trench 322 formed around the speaker grill 310.

As described herein, the trench 322 and slot 318 may have an undercut formed therein that prevents the plastic trim ring (not shown in FIG. 3C) from being removed. This undercut may, in an embodiment, be formed along an edge of the C-cover 308 where the slot 318 and trench 322 are formed so that a portion of the plastic trim ring may be locked into the trench 322 and slot 318 when placed or formed therein. In an embodiment, the plastic trim ring may be formed into the slot 318 and trench 322 using nano-molding technology (NMT). In this embodiment, the metal of the C-cover 308 may be directly bonded to the plastic trim ring 312 by creating the slot 318 and trench 322 as well as the undercut by, for example, acid etching those structures. The NMT may, once the slot 318, trench 322, and undercut are acid-etched, continue with molding the plastic trim ring into the slot 318 and trench 322 using compression molding, transfer molding, injection molding, or other types of plastic molding processes.

In an embodiment, the trench 322 may include at least one interlocking hole 316. The interlocking hole 316 may be used to secure the trim ring within the trench 322 when the trim ring is coupled to the slot 318 and trench 322. Similar to the undercut formed in the trench 322 and slot 318, the interlocking hole 316 may secure the trim ring within the trench 322 and, in this case, prevent the trim ring from moving laterally within the trench 322 and slot 318. The interlocking hole 316 may, therefore, tightly secure the trim ring within the trench 322 increasing the stability of the plastic trim ring around the speaker grill 310 and maintaining the aesthetic characteristics of the speaker grill 310 of the information handling system.

Similar to FIG. 3B, the C-cover 308 is depicted in FIG. 3C as including a plurality of vias 314. The vias 314 may each receive a key from a keyboard. Thus, although FIG. 3C does not show a keyboard operatively coupled to the C-cover 308, the present disclosure contemplates that, during assembly, a keyboard may be operatively coupled to the C-cover 308.

As described herein, the slot 318 may have a first length along a first edge 324 of the speaker grill 310, a second length along a second edge 326 of the speaker grill 310, and a third length along a third edge 328 of the speaker grill 310. In this embodiment, the slot 318 has been formed around a lower portion of the speaker grill 310. In an embodiment the first length along a first edge 324 may be 70 mm with matching length on the third edge 328 so that the slot 318 may be tuned to match a specific RF wavelength associated with, for example, a cellular communication protocol as described herein. In an embodiment the first length along a first edge 324 may be 40 mm with matching length on the third edge 328 so that the slot 318 may be tuned to match a specific RF wavelength associated with, for example, a cellular communication protocol as described herein. In any embodiment presented herein, the overall length of the slot 318 (i.e., the accumulated length of the first length along the first edge 324 of the slot 318, the second length of the second edge 326 of the slot 318, and third length of the third edge 328) formed at a perimeter of the speaker grill 310 may be created based on the RF EM frequencies to be emitted by the speaker grill 310 and the present disclosure contemplates other lengths of the slot 318 in order to emit those RF EM waves. During operation of the speaker grill platform antenna system, the speaker grill 310 may be excited via excitation of the speaker grill 310 with a current from a front-end module and an antenna feed. The excitation of the speaker grill 310 may cause high impedance at the edges of the speaker grill 310 where the slot 318 has been formed around the speaker grill 310.

Figure 3D:
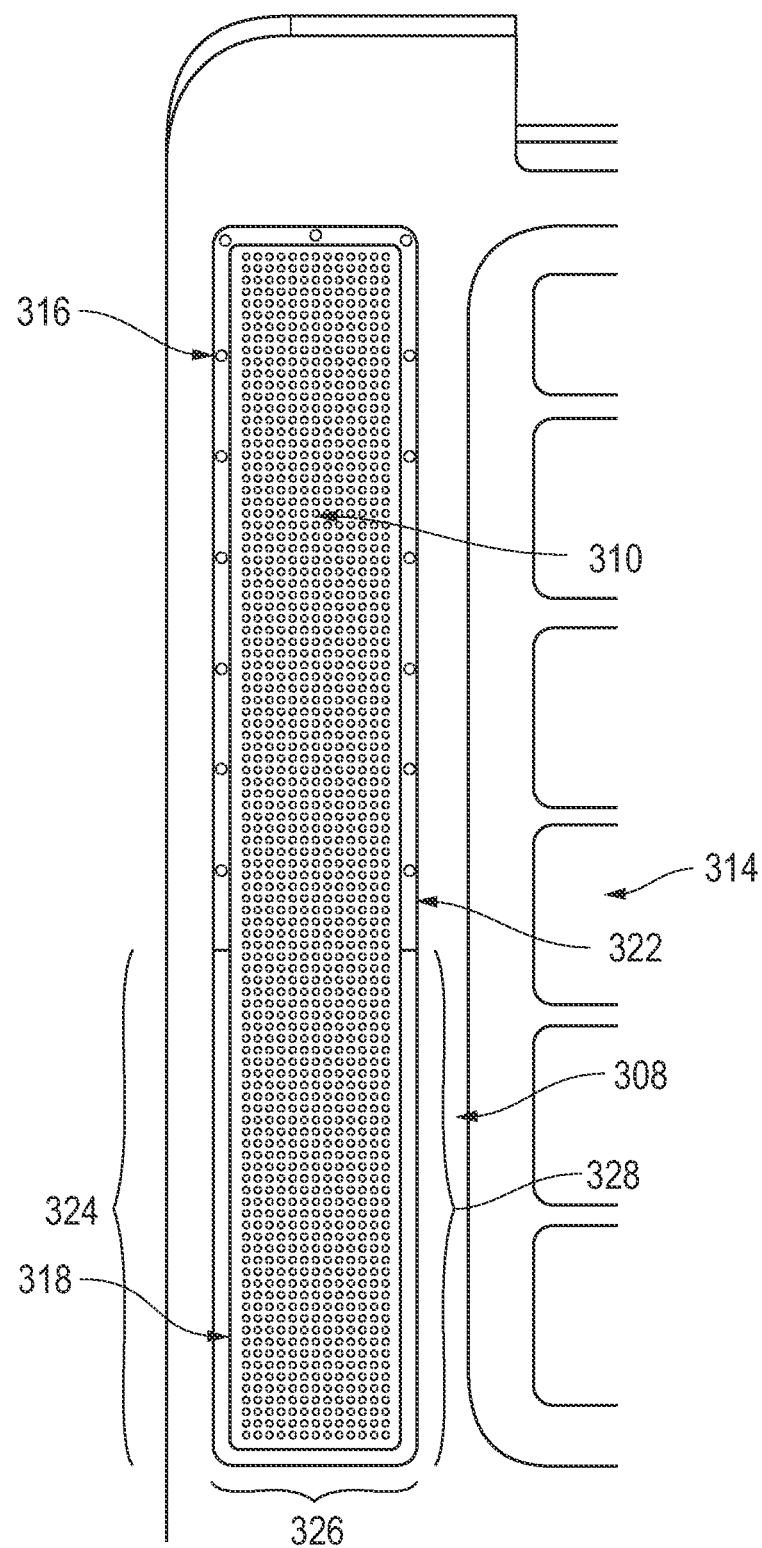
FIG. 3D is a graphical illustration of another speaker grill formed into a C-cover of an information handling system according to an embodiment of the present disclosure.
Figure 3H:
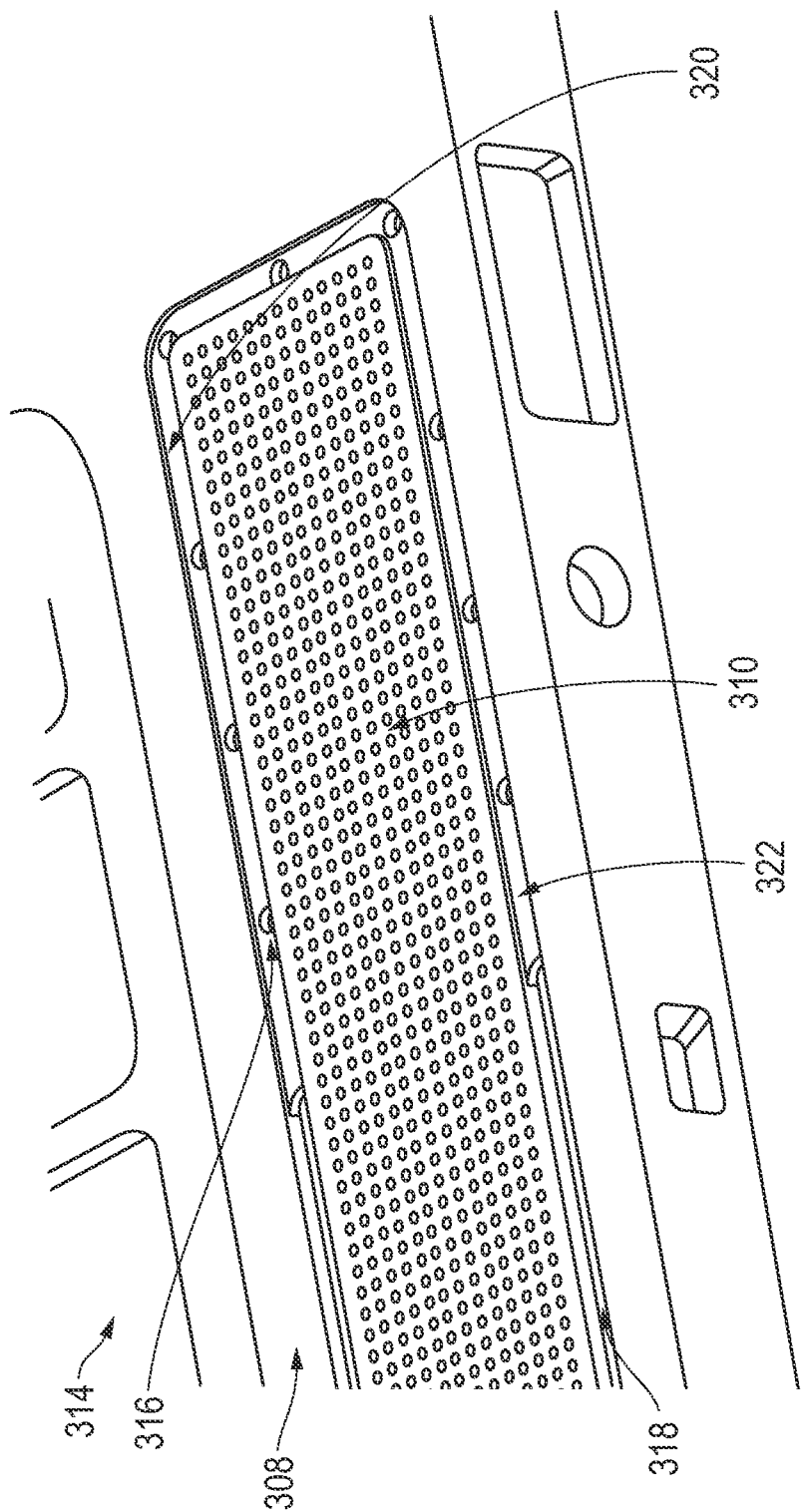
FIG. 3E is a perspective graphical illustration of a speaker grill formed into a C-cover of an information handling system according to another embodiment of the present disclosure.
FIG. 3F is a cut-out, perspective view of a speaker grill and speaker housed within a cavity formed behind the speaker grill according to an embodiment of the present disclosure.
FIG. 3G is rear, perspective view of a plurality of speaker grills and speakers housed within a plurality of cavities formed behind the speaker grills according to an embodiment of the present disclosure.

Additionally, although FIG. 3C shows a speaker grill 310 formed on a right side of the C-cover 308, the present disclosure contemplates that the speaker grill 310 or an additional speaker grills 310 may be formed on other edges or surfaces of the C-cover 308 such as shown in FIG. 3D. FIG. 3D is a graphical illustration of another speaker grill 310 formed into a C-cover of an information handling system according to an embodiment of the present disclosure. The speaker grill 310 shown in the FIG. 3D may be similar to some aspects of the speaker grill 310 shown in FIG. 3C. In the speaker grill 310 shown in FIG. 3D, a slot 318 may be formed around a partial perimeter of the speaker grill 310 for, in an embodiment, a speaker grill platform antenna. The slot 318 may terminate at a trench 322 formed around a remaining portion of the perimeter of the speaker grill 310.

During assembly, a trim ring (not shown in FIG. 3D) may be formed into the slot 318 and trench 322 via compression molding, transfer molding, injection molding, or other types of plastic molding processes. The placement of the trim ring into the trench 322 and slot 318 prevents objects from passing through the slot 318 and into the C-cover 308 and D-cover 304 assembly. Additionally, the trim ring may be formed to be level with a surface of the C-cover 308. The trim ring may, therefor, appear to a user to be an accentuating feature of the information handling system while hiding the purpose of the slot 318, trench 322, and speaker grill 310: emissions of RF EM waves. Because the plastic trim ring is RF transparent, the RF EM wave may be propagated away from the information handling system via the speaker grill platform antenna in some embodiments.

The trench 322 and slot 318 may also include an undercut formed one or both of the sides of the trench 322 and slot 318. The undercut may prevent the vertical movement out of the trim ring so that the trim ring remains in the slot 318 and trench 322. By securing the trim ring via use of the undercut, the trim ring may not be removed by the user thereby preventing damage to the components of the information handling system if objects were to be passed through the slot 318. FIG. 3D also shows at least one interlocking hole 316 that also prevents the trim ring from moving horizontally within the trench 322. Again, this prevents the removal of the plastic trim ring by the user from the trench 322. During assembly, the plastic of the plastic trim ring may be compressed into the interlocking hole 316 and undercut so that there is a locking fit between the trim ring and the speaker grill 310 and C-cover 308.

FIG. 3D shows a slot 318 that is relatively shorter than that slot shown in FIG. 3C. In an embodiment, the slot 318 may have a first length, second length, and a third length formed along a first edge 324, a second edge 326, and a third edge 328, respectively. Thus, the slot 318 may be formed around three edges 324, 326, 328 of the speaker grill 310 creating a peninsula of metal of the speaker grill 310. In an embodiment, the length of the first length along the first edge 324 is between 20 mm and 40 mm. In any embodiment presented herein, the overall length of the slot 318 (i.e., the accumulated length of the first length of the slot 318, the second length of the slot 318 and the third length of the slot 318) formed at a perimeter of the speaker grill 310 may be created based on the RF EM frequencies to be emitted by the speaker grill 310 and the present specification contemplates other lengths of the slot 318 along the edges 324, 326, and 328 in order to emit those RF EM waves. In some embodiments, during operation of the speaker grill platform antenna system, the speaker grill 310 may be excited via excitation of the speaker grill 310 with a current from a front-end module and an antenna feed. The excitation of the speaker grill 310 may cause high impedance at the edges of the speaker grill 310 where the slot 318 has been formed around the speaker grill 310.

In any embodiment described herein including those shown in FIGS. 3C and 3D, the width of the slot 318 may be 1.5 mm. Again, along with the length of the slot 318, the width (e.g., 1.5 mm) of the slot 318 may be selected to be suitably wide so that a specific RF EM wave may be emitted by the speaker grill platform antenna without interference with the metal of the C-cover 308. Thus, the width of the slot 318 may be selected to not only physically separate a portion of the speaker grill 310 from the C-cover 308 but also operatively separate the portion of the speaker grill 310 from the C-cover 308 as a peninsula. The portion of the speaker grill 310 may be operatively separated from the C-cover 308 such that the RF EM wave emissions from the edges 324, 326, and 328 of the speaker grill 310 or from underneath the speaker grill 310 may propagate without interference from the metal of the C-cover 308. Consequently, in any embodiment presented herein, the width of the slot 318 may be at least wide enough to allow such propagation by the creation of a high inductance at the edges of the peninsula.

FIG. 3E is a perspective graphical illustration of a speaker grill 310 formed into a C-cover 308 of an information handling system according to another embodiment of the present disclosure. FIG. 3E shows further details of the undercut 320 formed into the trench 322. Although FIG. 3E does not show the undercut formed into the slot 318, the present disclosure contemplates that the undercut 320 is also formed into the slot 318 so as to also retain the trim ring 312 within that portion of the perimeter of the speaker grill 310.

Also shown in FIG. 3E are the interlocking holes 316 of which, in this example, there are nine. Although FIG. 3E shows nine interlocking holes 316 being formed within the trench 322, the present disclosure contemplates that there may be more or less than nine interlocking holes 316 and FIG. 3E is merely an example. The interlocking holes 316 may be filled with the plastic used to form the plastic trim ring (not shown in FIG. 3E) during an NMT process as described herein. During this process the plastic used to form the trim ring may be pressed into the interlocking holes 316 as well as the undercut 320 and allowed to solidify. After solidification of the plastic, the trim ring is prevented from moving within or out of the slot 318 and trench 322: the undercut 320 preventing vertical movement of the trim ring away from the surface of the C-cover 308 and the interlocking holes 316 preventing movement of the trim ring horizontally. Thus, during use, a user is prevented from removing the trim ring thereby potentially compromising the electrical and mechanical devices placed within the C-cover 308 and D-cover 304 assembly.

The speaker grill 310 may have a number of holes defined therein. These holes may allow sound waves from a speaker 355 to pass through. In an embodiment, the speaker 355 may be placed below the speaker grill 310. In a specific embodiment, the speaker 355 may be placed at a location away from the antenna element. In an embodiment, the speaker 355 is placed below the speaker grill 310 in a location where the speaker grill 310 is coupled to the C-cover 308 and not where the slot 318 has been formed around the speaker grill 310 to form the speaker grill platform antenna.

Figure 3F:
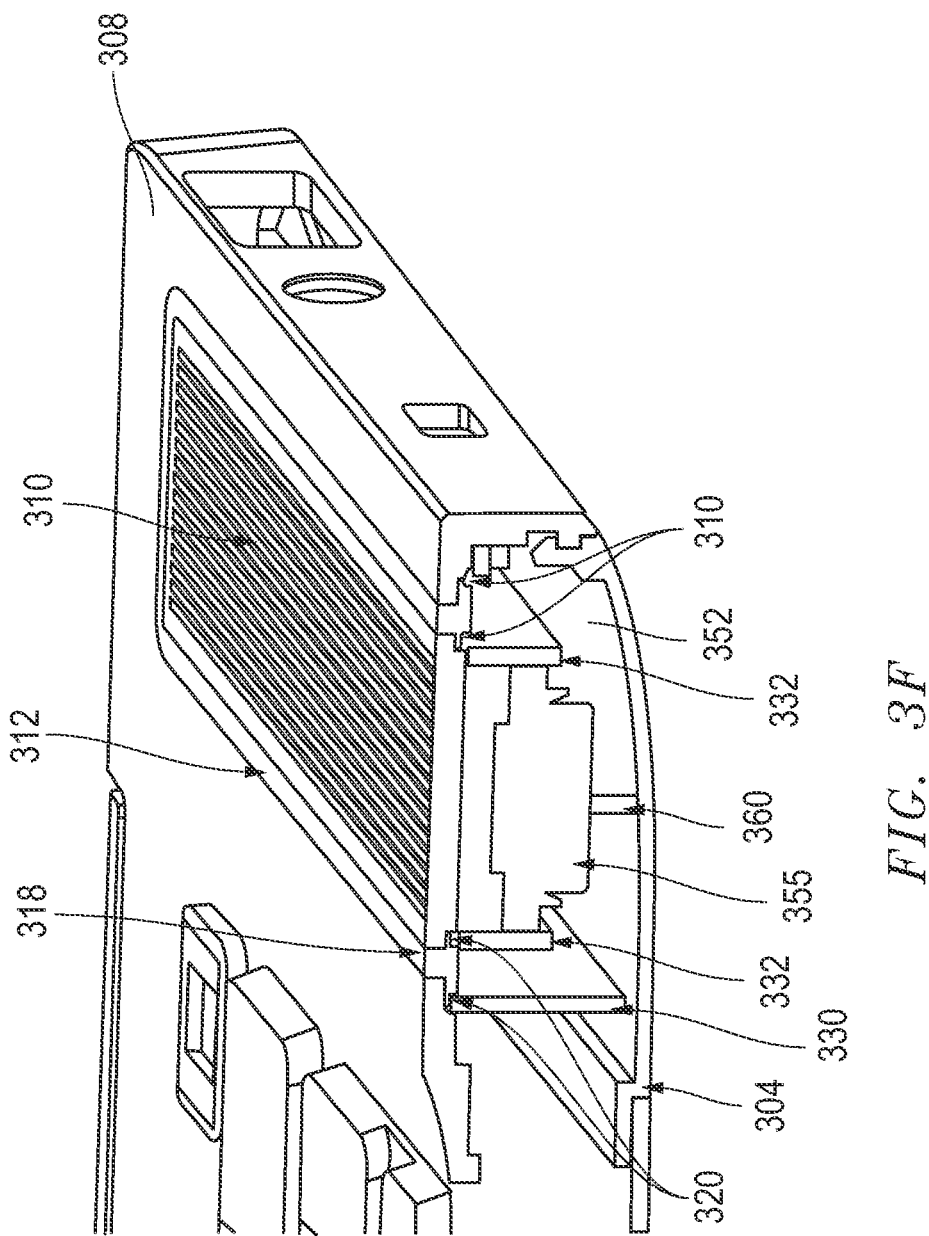

FIG. 3F is a cut-out, perspective view of a speaker grill 310 and speaker 355 housed within a cavity 350 formed behind the speaker grill 310 according to an embodiment of the present disclosure. As described herein, the speaker grill 310 may have a slot 318 formed around a portion of the speaker grill 310 with a plastic trim ring molded therein to hide the presence of the slot 318 and provide a physical barrier between the top of the C-cover 308 and those elements and components placed within the C-cover 308 and D-cover 304. The plastic trim ring may be maintained within the slot 318 via a number of undercuts 320 formed within the slot 318. Again, although FIG. 3F describes the speaker grill 310 as being the radiating element based on the presence of the slot 318 by which the RF signal may be emitted from. However, the present disclosure contemplates that use of a separate, stand-alone antenna element placed within the cavity 350 to emit RF signals therefrom.

The speaker grill 310 of FIG. 3F may help to house a speaker 355 therein. The speaker may be any device that receives a signal from the processor and produces audio as input to the user. This output may be any type of audio including music and notification sounds. As described herein, the speaker may be co-located with the antenna system in order to decrease the footprint of the speaker and antenna systems consumed within the information handling system. In some embodiments presented herein, the antennas may include a portion of the speaker grill 310 which is excited by an excitation signal from the antenna front end 125 that causes a signal to be emitted from the speaker grill. In other embodiments presented herein, the antennas include an antenna element placed behind speaker grill in the cavity 350 (not shown in FIG. 3F) which is excited by an excitation signal from the antenna front end that causes a signal to be emitted from behind the speaker grill 310.

In an embodiment, the speaker 355 may include an electroacoustic transducer or voice coil. The electroacoustic transducer may translate electrical audio signals into sound and in dynamic microphones to translate sound waves into an electrical audio signal. In this embodiment, the electroacoustic transducer may provide motive force to a cone or other diaphragm to create the audio waves for the speaker 355. Because the electroacoustic transducer receives a current from a voltage source, electromagnetic induction, electrostatic coupling, or conduction may result from the passage of current through the electroacoustic transducer and create EMI in relation to the RF signals emitted by the antenna elements. According to certain embodiments of the present disclosure, that electromagnetic induction, electrostatic coupling, or conduction may be grounded using metallic shielding walls 330 surrounding the speaker grill 310. In the embodiments of the present disclosure, the metallic shielding walls 330 may be coupled to a grounding source such as a C-cover or D-cover to ground the EMI preventing the EMI from interfering with the transmission of the RF signals from the antenna element. Further, the metallic shielding walls 330 may prevent external EMI originating from circuits, other antennas, or a power source of the information handling system such as from the base chassis from interfering with the antenna systems in the cavity 350 as described herein. As such an EMI shield is formed to isolate and shield the cavity 350 from the EMI. By extending metallic walls down from the C-cover 308 or up from the D-cover 304, the EMI shield may be formed creating a cavity 350 within which the antenna and speaker 355 may operate.

As described, in a first embodiment, the metallic shielding walls 330 may be formed on the C-cover 308 and extend towards a D-cover 304. In this embodiment, portions of the C-cover 308 and D-cover 304 may serve as one or more of the metallic shielding walls 330 as well as a result of the C-cover 308 and D-cover 304 being made of a metal as well. In a second embodiment, the metallic shielding walls 330 may be formed on the D-cover 304 and extend towards the C-cover 308. The present description, however, will describe the formation of the cavity 350 via metallic shielding walls 330 that are formed on the C-cover 308 and extend towards the D-cover 304 although this alternative embodiment is contemplated by the present disclosure.

The metallic shielding walls 330 may be sealed to the D-cover 304 using a conductive rubber gasket 328, a conductive sealant, or combinations thereof. As described herein, the cavity 350 is also sealed in order to increase the audio qualities of the sound produced by the speaker 355 by, for example, preventing sound waves generated by the rearward-facing surfaces within the cavity 350 from interacting with sound waves generated at the front of the speaker 355. By sealing the cavity 350 with the conductive rubber gasket 328, the sound waves produced by the speaker 355 may be maintained within, at least, the cavity 350 and projected out of the speaker grill 310.

The metallic shielding walls 330 may also be sealed to the D-cover 304 with the conductive rubber gasket 328 in order to conductively seal the cavity 350. During operation of the information handling system described herein, various electrical components of the information handling system including the speaker 355 and antenna element may produce electrical fields that may interfere with the propagation of the RF EM waves produced by the antenna or interferes with received signals at the antenna. In the embodiments presented herein, the metallic shielding walls 330 and the conductive rubber gasket 328 may serve as a grounding source for this EMI such that it grounds the EMI preventing operation of elements within the information handling system from interfering with the transmission of the RF EM signals. By bridging a metallic C-cover 308 and D-cover 304 through the metallic shielding walls 330, the presently described embodiments effectively reduce or eliminate cavity resonance modes, errant EMI, and unintended ground current coupling from occurring thereby increasing the ability of the antenna to transmit RF EM signals. By increasing the efficiency and ability of the antenna to transmit RF EM signals, data may be effectively transmitted and received wirelessly from and to the information handling system thereby increasing the usability of the information handling system. Additionally, the presently described embodiments allows more flexibility in antenna element sizing to achieve specific target bandwidths that would not be possible without increasing the form factor of the information handling system or increasing the footprint of the cavity 350 or adding a separate antenna cavity and thereby decreasing the available footprint for other internal components of the information handling system.

In the embodiments presented herein, the cavity 350 may house a plurality of plastic speaker arms 332. The plastic speaker arms 332 may be made of a plastic or other type of RF transparent material in some embodiments. The plastic speaker arms 332 may extend from the C-cover 308 or the speaker grill 310. The plastic speaker arms 332 may be used to hold the speaker 355 against or close to a portion of the speaker grill 310 so that the speaker 355 is not in contact with the D-cover 304. In an embodiment, the plastic speaker arms 332 may extend along the speaker grill 310 a distance equal to or less than the length of the speaker 355. FIG. 3F shows a cross cut view of the speaker 355 and speaker grill 310 that may extend along the surface of the C-cover 308 longer than is shown. In some embodiments, the speaker 355 may run along a portion of the length of the speaker grill 310 with a remaining portion of the length of the speaker grill 310 reserved for operation as an antenna element or the placement of the antenna element underneath as described herein. In this specific embodiment, a portion of the speaker grill 310 behind which the speaker 355 is placed may be used to emit audio waves while the remaining portion of the speaker grill 310 is used to transceive RF EM waves from the cavity 350 or speaker grill 310.

In an embodiment, the cavity 350 may also house a foam rib 360 placed between the speaker 355 and the D-cover 304. The foam rib 360 may be placed between the speaker 355 and D-cover 304 in order to maintain the speaker 355 above the D-cover 304. The type of material, in this embodiment foam, may be selected based on the position of the transducer of the speaker 355 and the effects of vibrations of the speaker 355 during operation. A foam rib 360 may be reasonably elastically pliant such that the speaker 355 may be maintained in the position with the plastic speaker arms 332 while not effecting the audio characteristics of the audio waves produced by the speaker 355. In some embodiments presented herein, the foam rib 360 may be made of an RF transparent material.

Figure 3G:
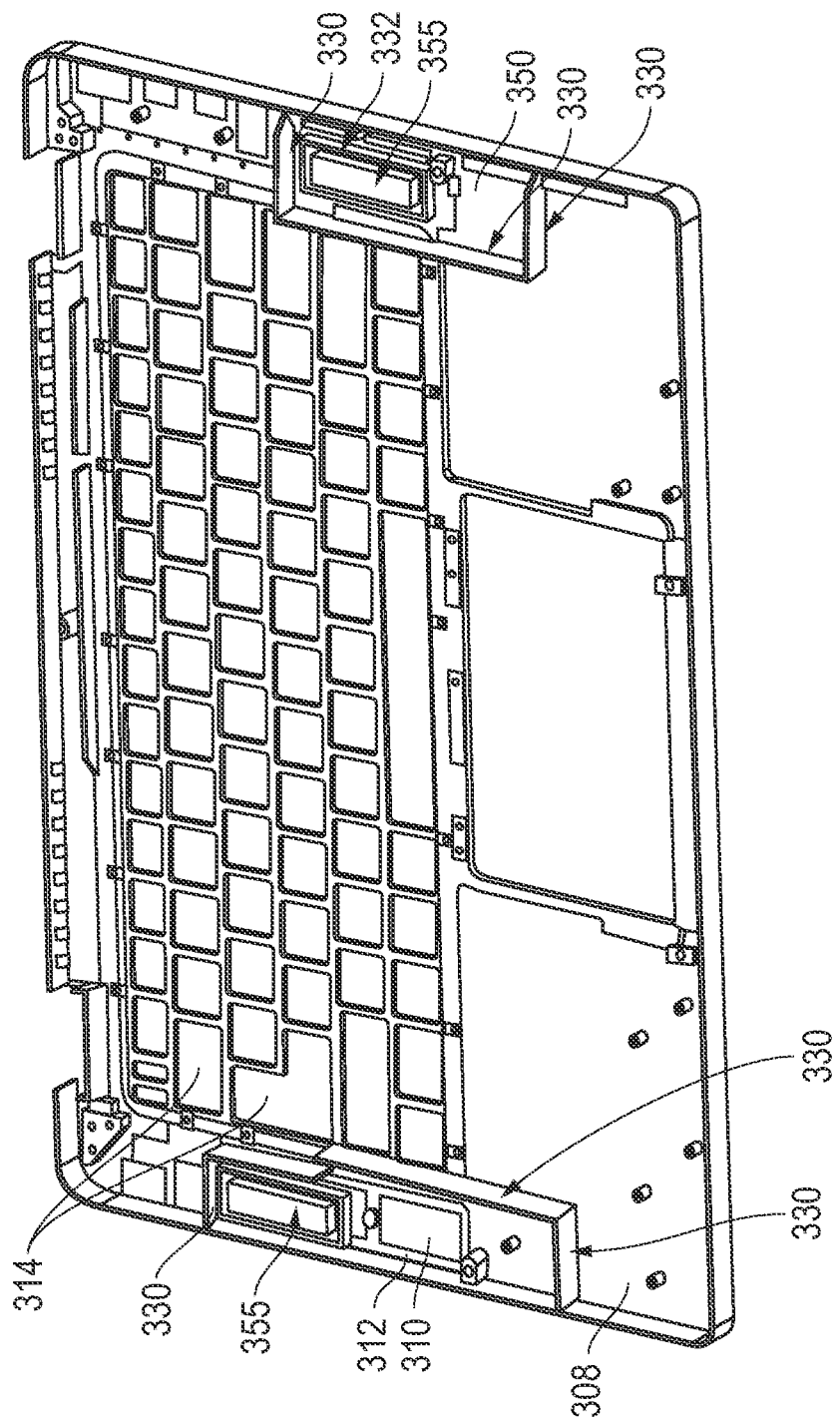

FIG. 3G is rear, perspective view of a plurality of speaker grills 310 and speakers housed within a plurality of cavities 350 formed behind the speaker grills 310 according to an embodiment of the present disclosure. FIG. 3G shows the back side of the C-cover 308 with other elements of the information handling system removed such as the keyboard and D-cover 304 for ease of illustration and explanation. The present disclosure, however, contemplates that these other elements not shown in FIG. 3G may be assembled to the C-cover 308 during a manufacturing process of the information handling system.

The C-cover 308 includes two cavities 350 with, in some embodiments, each housing a speaker 355 and an antenna element. In FIG. 3G the information handling system includes two speakers 355: one placed at each side of the keyboard and running parallel to the edges of the C-cover 308. The present disclosure contemplates, however, that there may be more or less cavities 350 than shown in FIG. 3G and placed at locations within the C-cover 308 other than or in addition to the locations shown in FIG. 3G. The present disclosure contemplates as well that there may be more or less cavities 350 than shown in FIG. 3G with one or more speakers 355 and antenna systems placed within any of the cavities 350.

As described in the embodiments presented herein, each cavity 350 may be defined by a number of metallic shielding walls 330 that may or may not include portions of the C-cover 308 and D-cover 304. In the specific example shown in FIG. 3G, a single C-cover 308 wall, serves as at least one of the metallic shielding walls 330 that form the cavity 350. The remaining metallic shielding walls 330 that enclose the cavity 350 may be formed as part of the C-cover 308 and extend perpendicularly from the interior surface of the C-cover 308.

Each of the cavities may house any number of speakers 355 and antenna elements. In the embodiment shown in FIG. 3G, each of the two cavities 350 includes a single speaker 355. The presence of the two speakers 355 may allow the information handling system to present stereophonic sound to a user thereby increasing the audio characteristics of the audio output. FIG. 3G shows a first cavity 350 located on a right side of the figure (the left side of the C-cover 308 when oriented in an upright configuration) may include a speaker 355 that covers all or a majority of the speaker grill 310. In this embodiment, an antenna element may be located within a remaining portion of the cavity 350 or, in this example, along an edge of the speaker 355 at the speaker grill 310 and an aperture slot along the speaker grill edge. In this specific embodiment, the antenna element may be excited using a current and voltage source. As described herein, the antenna system in this embodiment may act as a cavity-backed slot antenna using the slot formed around a portion of the speaker grill as the slot that emits the RF EM waves as excited by a monopole antenna (not shown in cut away). The antenna element may be capacitively coupled to the slot at the edge of the speaker grill 310.

FIG. 3G also shows a second cavity 350 located on the left side of the figure (the right side of the C-cover 308 when oriented in an upright configuration) that includes a speaker 355 with its transducer and a peninsula formed on the speaker grill 310. In this embodiment, the speaker 355 may cover a portion of the entire speaker grill 310 with all or a portion of the remainder of the speaker grill 310 having a slot formed around the speaker grill 310 such that a peninsula portion may be excited as an antenna element. As described herein, the slot 318 may have a plastic trim ring 312 molded into the slot 318 to prevent the passage of objects through the C-cover 308. An excitation element may be coupled to the peninsula formed at the portion of the speaker grill 310 by the slot 318 so as to cause the peninsula to be excited and act as the RF EM emission device and to receive EM RF signals.

In an embodiment, the D-cover 304 may serve as one of the metallic shielding walls (cut away), the C-cover 308 serves as a top metallic shielding wall, and a number of metallic shielding walls 330 may be formed to create the cavity 350 described herein. In these embodiments, although the C-cover 308 and D-covers 304 serve as one or more of the walls that form the cavity 350, alternative embodiments may be formed by metallic shielding walls 330 formed within and independent of the C-cover 308 and D-cover 304. Further, a metallic covered speaker cavity insert may serve as one or more metallic EMI shielding walls 330 in some embodiments. Thus, the presently described and depicted arrangement of metallic shielding walls 330 is merely an example, the present disclosure contemplates that other arrangements of the metallic shielding walls 330 used to create the cavity 350 may be used. The formation of the metallic shielding walls 330 as shown in FIG. 3G, however, may include less manufacturing process as well as increase the footprint available within the C-cover 308 and D-cover 304 assembly than could be realized by forming an independent antenna cavity 250 inside the C-cover 308 and D-cover 304.

Figure 4A:
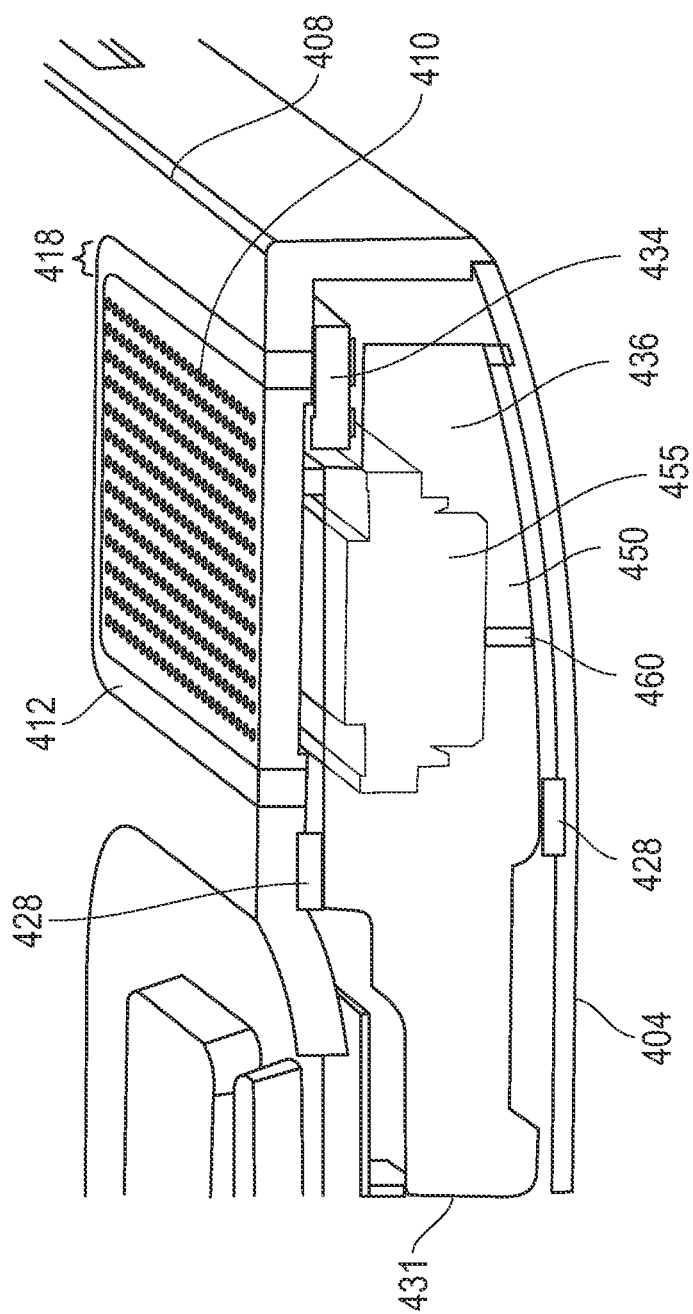
FIG. 4A is a cut-out, perspective view of a speaker grill and speaker housed within a cavity formed behind the speaker grill according to another embodiment of the present disclosure.

FIG. 4A is a cut-out, perspective view of a speaker grill 410 and speaker 424 housed within a cavity 450 formed behind the speaker grill 410 according to another embodiment of the present disclosure. The cavity 450 shown in FIG. 4A shows that the cavity 450 may be expanded beyond the size of the cavity shown in FIGS. 3F and 3G. In this embodiment, the cavity houses a speaker 424 and an antenna element thereby allowing for the co-location of those elements within an EMI insulated cavity 450.

The cavity 450 may include the plastic arms and foam rib 426 used to maintain the speaker 424 in position. Because both the foam rib 426 and plastic arms are made of an RF transparent material, the RF transmissions produced by the antenna element within the cavity 450. Although the present disclosure describes the use of the plastic arms and foam rib 426 to hold the speaker 424 in place, the present disclosure further contemplates other devices that may hold the speaker 424 up towards the speaker grill 410 and away from the D-cover 404.

FIG. 4A shows another embodiment to form the cavity 450. In this embodiment, although certain walls of the C-cover 408 and D-cover 404 may be used to form the cavity 450, other walls of the cavity 450 are formed by adding a thin conductive layer around non-metallic mediums housed within the C-cover. These non-metallic mediums may be any internal components including, for example, a plastic audio insert 436 used to define an audio cavity. In this specific embodiment, an internal or external surface of the plastic audio insert 436 may be overlaid with a conductive material such as a metallic foil thereby forming a metallic overlay 431 within the cavity 450. In an embodiment, the metallic foil may be aluminum, titanium, or any other type of metal. In an embodiment, the metallic foil may be a metallic overlay 431 that, in an embodiment, is a metal spray coating that is coated into a surface of a plastic audio insert 436 inserted into the cavity 450. Similar to the embodiments, shown in FIGS. 3F and 3G, the metallic walls of the C-cover 308 and D-cover 304 as well as the metallic overlay 431 portions that define the cavity 450 may form a grounding path to ground EMI originating within and without of the cavity 450 thereby preventing the EMI from interfering with the transmission of the RF signals from the antenna element. As such, an EMI shield is formed using the metallic walls and metallic overlay 431 to isolate and shield the cavity 450 from the EMI.

The expansion of the cavity 450 relative to that shown and described in connection with FIGS. 3F and 3G may provide for an increase in the size of the acoustic back volume within the cavity 450 so that the type of speaker 424 placed within the cavity 450 may be customized based on the volume of the cavity 450. Additional audio back volume may support deeper bass tones in audio output according to various speaker specifications. The expansion of the cavity 450 relative to that shown and described in connection with FIGS. 3F and 3G may also provide for a cavity 450 that may incorporate irregular-shaped and customized antenna structures within the cavity that now has an increased amount of volume as a result of the use of the metallic overlay 431.

As described, the cavity 450 may include a plastic audio insert 436 that may serve as the non-metallic surfaces onto which the metallic overlay 431 may be placed. In an embodiment, the dimensions of the plastic audio insert 436 may define one or more walls that define the cavity 450. Wherever the plastic audio insert 436 defines a wall at which the cavity 450 terminates, the plastic audio insert 436 may be overlaid with a metallic overlay 431 as a wrap or metallic coating in some embodiments. In an embodiment, the metallic overlay 431 may be formed on the inside of the plastic audio chamber. In an embodiment, the metallic overlay 431 may be formed on the outside of the plastic audio chamber. Because the plastic audio insert 436 may be extended and overlaid with the metallic overlay 431, the size of the cavity 450 may be increased up and to include any nearby voids that may be present within the C-cover 308 thereby taking advantage of any available space within the C-cover 308 for audio back volumes. This may increase the size of the cavity 450 while also utilizing any available space within the C-cover 308 thereby efficiently utilizing more of the overall size of the information handling system. By doing so, portions of the information handling system generally may be utilized for multiple purposes and the aesthetics of the information handling system may be maintained thereby improving user satisfaction.

In order to act as a grounding path, the metallic overlay 431 may be electrically coupled to a conductive rubber gasket 428 or other types of conductive sealing devices. The conductive rubber gasket 428 may be electrically coupled to a grounding source such as the C-cover 308 and D-cover 304 in order to ground any EMI as described herein. The grounding of the EMI allows the antenna element 434 to operate according to the abilities of the antenna element 434 without interference from cavity resonance modes, errant EMI, and unintended ground current couplings at or near the cavity 450. In an embodiment, the antenna element 434 may be excited by an excitation signal from the antenna front end of the information handling system. The excitation of the antenna element 434 may capacitively couple the antenna to the slot 418 along some portion of the speaker grill edge for an aperture antenna format.

Figure 4B:
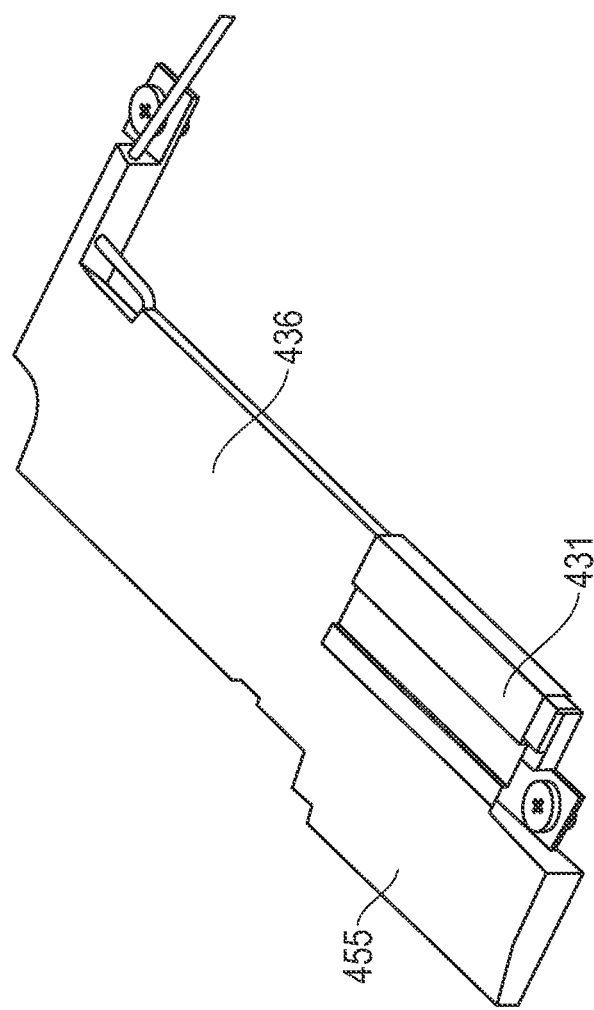
FIG. 4B is a perspective view of a plastic audio insert that may form part of the cavity behind a speaker grill according to an embodiment of the present disclosure.

FIG. 4B is a perspective view of a plastic audio insert 436 that may form part of the cavity behind a speaker grill according to an embodiment of the present disclosure. The plastic audio insert 436 may be made of any RF transparent material such as plastic so as to not interfere with the transmission of RF EM waves emitted by the antenna element within the cavity. As described herein, at least a portion of the plastic audio insert 436 may serve as an EMI shielding wall defining the cavity formed behind the speaker grill.

So as to create a conductive ground surface along the perimeter of the cavity, the plastic audio insert 436 may be overlaid with a metallic overlay 431. The metallic overlay 431 may be made of any type of conductive material such as aluminum, gold, copper, or the like. Additionally, as described herein, the metallic overlay 431 overlaid on the plastic audio insert 436 may be electrically coupled to a conductive rubber gasket 428 that serves as a continuance of a ground path to a grounding source associated with the cavity 450. Although FIG. 4B shows the metallic overlay 431 at a specific portion on the plastic audio insert 436, the present disclosure contemplates that additional metallic overlay 431 may be included on the plastic audio insert 436 or any other non-metallic surfaces. Further, the present disclosure contemplates that the placement of the metallic overlay 431 over the plastic audio insert 436 or other non-metallic surface may be located at other locations other than that depicted in FIG. 4B including inside the plastic audio insert 436 with contact to a ground in some embodiments.

Figure 4C:
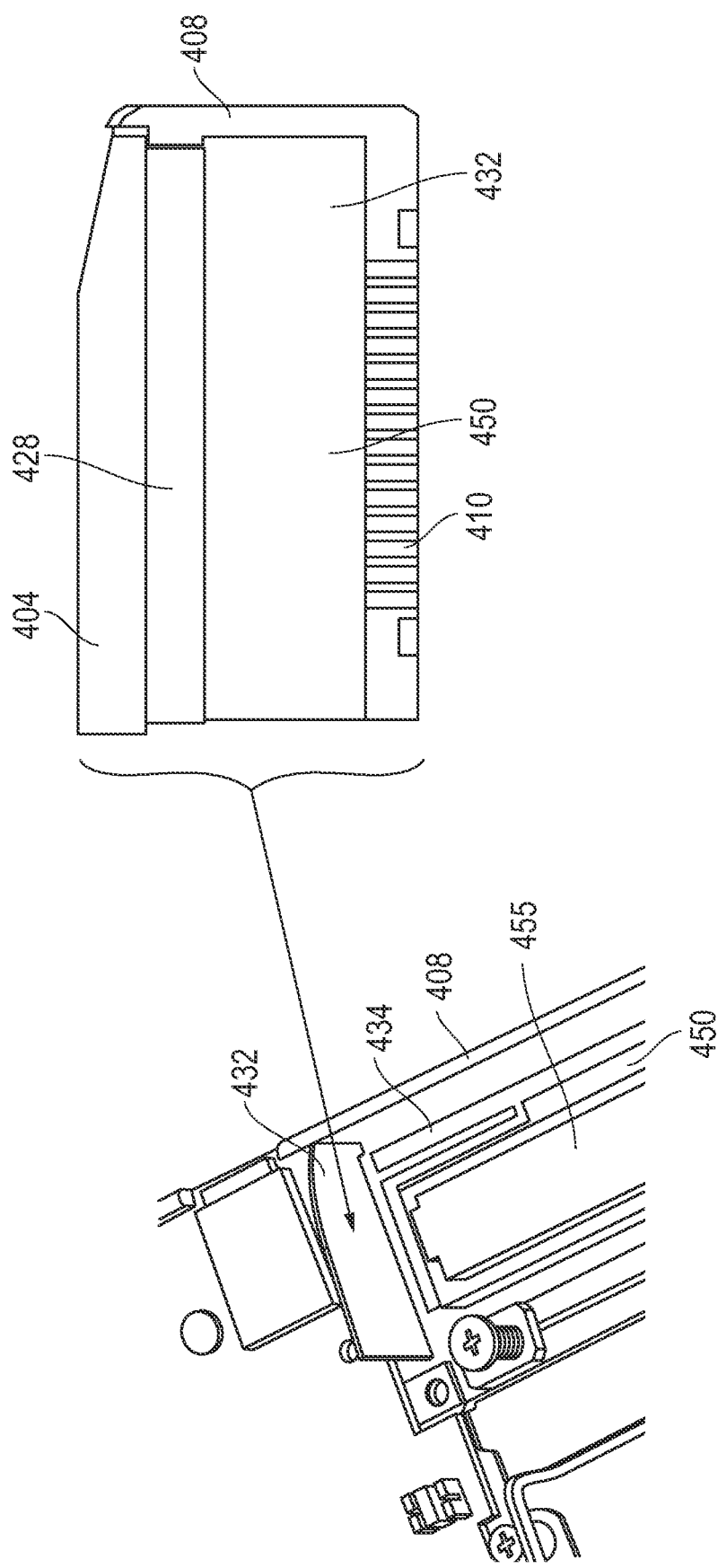
FIG. 4C is a perspective, cut-away view of a cavity housing a speaker and antenna element and a side, cross cut, close-up view of that perspective view of the cavity with D-cover attached according to an embodiment of the present disclosure.

FIG. 4C is a perspective, cut-away view of a cavity 450 housing a speaker 424 and antenna element 440 and a side, cross cut close-up of that perspective view of the cavity with D-cover 404 attached according to an embodiment of the present disclosure. As shown in FIG. 4C, a speaker 455 and antenna element 434 may be co-located within the cavity 450. In the embodiment shown in FIG. 4C, the antenna element 434 may be placed alongside the speaker 455 and below a slot formed in the speaker grill as described herein. Although FIG. 4C shows a specific type and placement of the antenna element 434, the present disclosure contemplates that any form and type of antenna element 434 may be co-located with the speaker 455 including monopole antennas, dipole antennas, aperture antennas, slot antennas, and waveguide antennas, among others. The antenna element 434 may be operated as a multiple-input, multiple-output (MIMO) antenna element 434 that exploits a multipath propagation operation during transmissions and receptions of signals. Other types of antenna elements 434 may be implemented in the present specification in order to communicate with any type of cellular or computing network. Antenna element 434 may transmit through a slot in the C-cover as a planar wire antenna system in some embodiments or capacitively couple to some portion of the slot to operate as an aperture antenna as described in other embodiments herein.

The cavity 450, as described herein, is defined by a plurality of walls that are formed of a metal or metallic overlay placed over a non-metallic surface. A back wall 432 is shown in FIG. 4C and the side, cross-cut and close up view of the back wall 432 is also shown. In the present embodiment, the cavity 450 includes a conductive rubber gasket 428 formed as a bottom surface of the cavity 450 interposed between the volume of the cavity 450 and the D-cover 404. In this embodiment, the conductive rubber gasket 428 provides a ground path to the D-cover 404 such that EMI at the cavity 450 is grounded away from the interior of the cavity 450 and away from the antenna element 434. The conductive rubber gasket 428 may form part or an entirety of the bottom surface of the cavity 450 closest to the D-cover 404.

FIG. 4C shows a side wall of the information handling system being formed by a portion of the C-cover 408 extending towards a D-cover 404 so as to enclose the cavity 450 as described herein. In a separate embodiment, a side wall of the information handling system may be a portion of the D-cover 404. In either embodiment, the portions of the C-cover 408 and D-cover 404 may be used to create an EMI shielding wall defining the cavity 450 formed behind the speaker grill 410. The speaker grill 410 may be used, in an embodiment, to propagate EM RF waves therefrom or allow RF EM waves to propagate from inside the cavity 450. Additionally, the speaker grill 410 may include a number of holes defined therein to allow audio waves produced by the speaker 455 to also propagate from within the cavity 450.

Figure 4D:
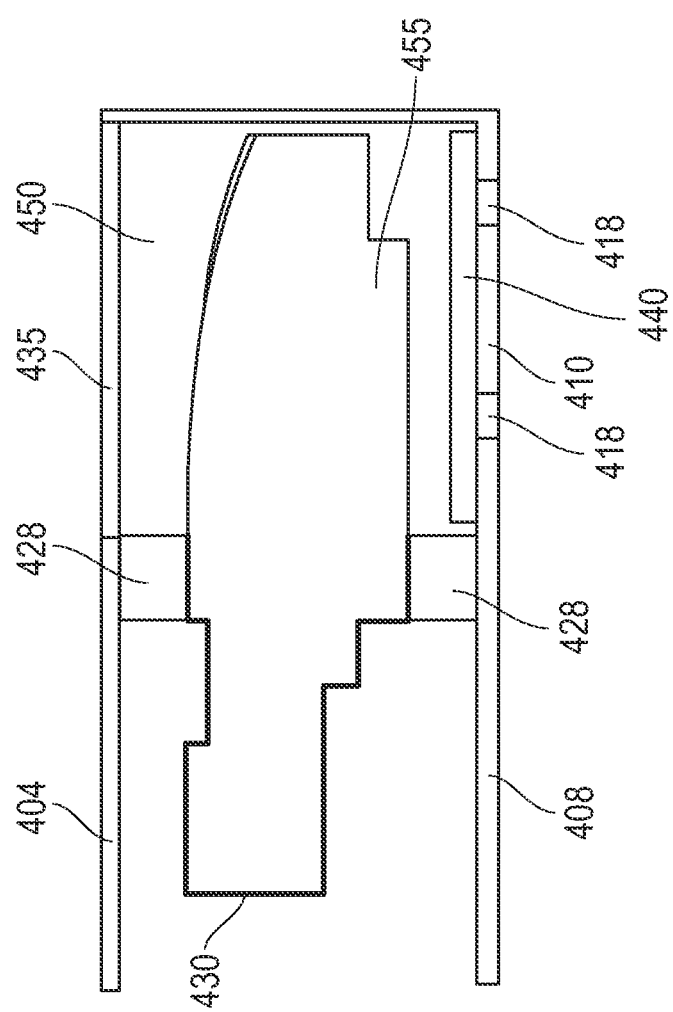
FIG. 4D is a side, cross-section view of a cavity according to an embodiment of the present disclosure.

FIG. 4D is a side, cross-section view of a cavity 450 according to an embodiment of the present disclosure. FIG. 4D shows an alternative placement of the antenna element 440 relative to the speaker 455. In this embodiment, the antenna element 434 may be located against the speaker grill 410. In some embodiments, the antenna element 434 may be coupled to a printed circuit board (PCB) used to mount the antenna element 434 to the speaker grill 410.

Similar to FIG. 4C, FIG. 4D shows a cavity 450 housing a speaker 455. The speaker 455 is placed behind the speaker grill 410 so that the speaker 455 may emit audio output out of the speaker grill 410 and to the user. In the embodiment shown in FIG. 4D, the speaker 455 may extend into the C-cover 408 and beyond the cavity defined by the metallic shielding walls 330 and conductive rubber gasket 428 that may form other boundaries of the cavity 450. Any extension of the speaker 355 past the conductive rubber gaskets 428 may have a metallic overlay 431 laid over any non-metallic structures such that the cavity 450 is extended while still creating and maintaining a conductive EMI isolation wall to reduce or eliminate cavity resonance modes, errant EMI, and unintended ground current coupling from occurring thereby increasing the ability of the antenna to transmit RF EM signals.

In an embodiment, the D-cover 404 may also include an antenna window 435. In this embodiment, the antenna window 435 shown in FIG. 4D in the D-cover 404 under the cavity 450 is made of an RF transparent material such as a plastic. In this embodiment, the antenna window 435 may allow for transmission of RF EM waves by the antenna element 434 through the D-cover 404. As described herein, the information handling system may include sensors that detect the orientation of the information handling system such as a tablet configuration, an open configuration, a closed configuration, and an easel configuration. The RF EM transmission and reception waves may be sent and received via the D-cover window 435 as well as via the speaker grill 410 at slots 418. In an embodiment, for example, as the sensors of the information handling system detect an orientation where the D-cover 404 is placed upside down with the keyboard facing down, the antenna element 440 may transceive RF EM waves out of the C-cover 408 and D-cover 404 assembly. The system described may also use any type of beamforming elements associated with the antenna element 440 such as a parasitic element in some embodiments. This embodiment with the antenna window 435 allows the information handling system to transmit and receive RF EM wave while the information handling system is placed in these various configurations. Although FIG. 4D shows the antenna window 435 formed in the D-cover 404, other embodiments include an antenna window 435 placed in the C-cover 408, a side of the base chassis, or no antenna window 435 may be formed in the base chassis of the information handling system.

Figure 5:
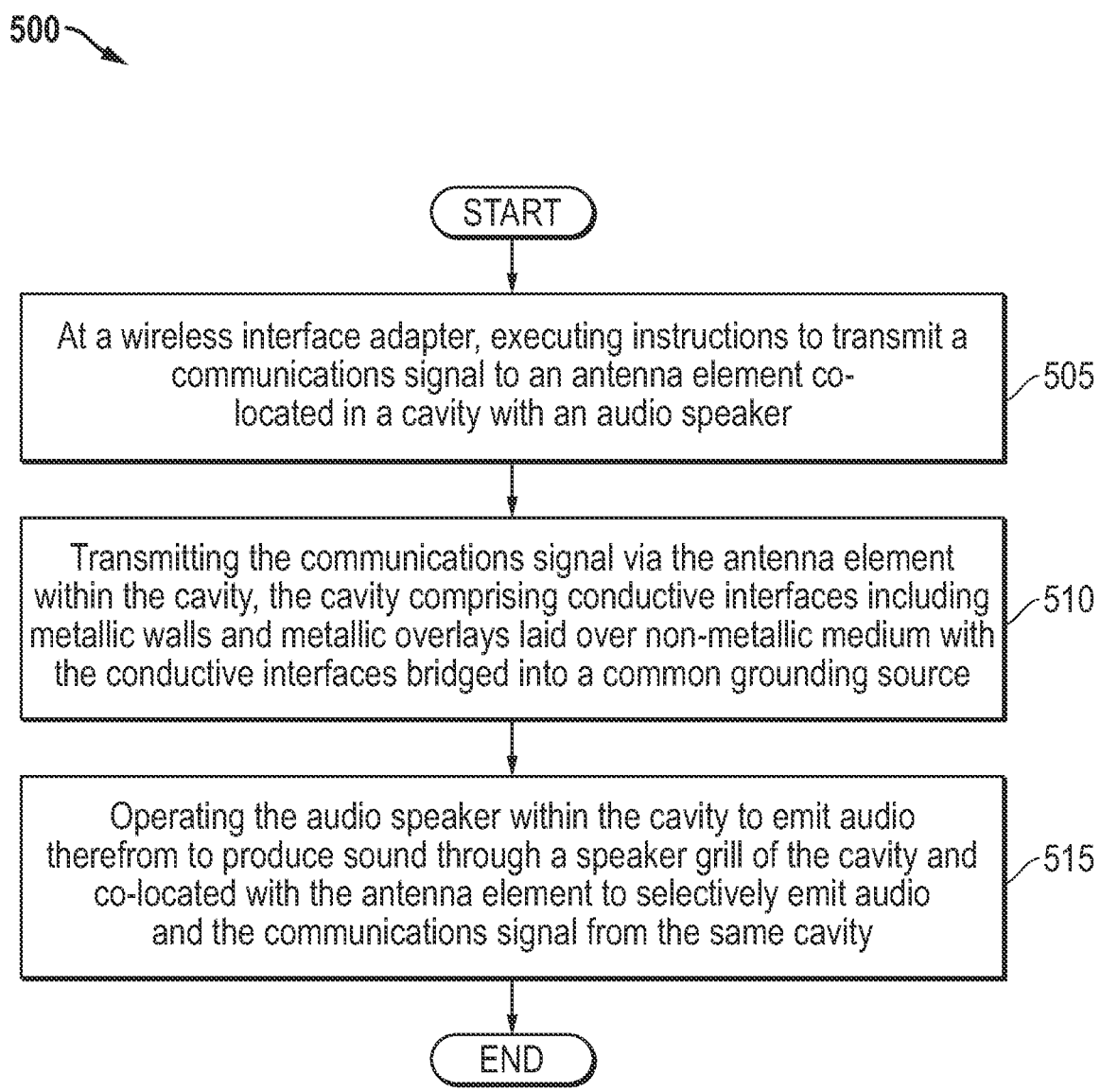
FIG. 5 is a flow diagram illustrating a method for operating an information handling system according to an embodiment of the present disclosure.

FIG. 5 is a flow diagram illustrating a method 500 for operating an information handling system according to an embodiment of the present disclosure. The method 500 may include, at a wireless interface adapter, executing, at block 505, executing instructions to transmit a communications signal to an antenna element co-located in a cavity with an audio speaker. In the embodiments presented herein, the speaker and antenna element may be co-located within the cavity with the cavity being insulated from cavity resonance modes, errant EMI, and unintended ground current coupling from occurring thereby increasing the ability of the antenna to transmit RF EM signals. The cavity may be insulted with the EMI shielding walls, metallic overlays, metallic walls, and conductive rubber gaskets, or a combination thereof.

As a result, the method 500 may include, during operation transmitting, at block 510, the communications signal via the antenna element within the cavity wherein the cavity comprises conductive interfaces including metallic walls and metallic overlays laid over non-metallic medium with the conductive interfaces bridged into a common grounding source. In any embodiment herein, a wireless adapter and front end may excite one or more of a peninsula of metal of the speaker grill defined by the slot formed around a portion of the speaker grill, a monopole antenna formed within the cavity, and an antenna element capacitively coupled to the slot at the edge of the speaker grill. Any or all of these types of antenna elements may be included in the cavity to emit RF EM waves out through the speaker grill, the antenna window, or a combination of either.

A conductive elastomer to hermetically seal the speaker and antenna element into the cavity to reduce cavity resonance within the cavity, errant electromagnetic interference (EMI), and unintended ground couplings within the cavity. In an embodiment, the conductive elastomer may be a conductive rubber gasket that is placed between a terminal end of the each of the metallic walls or metallic overlays and the D-cover. In an embodiment, a conductive rubber gasket may be placed over the entire portion of the D-cover thereby forming a bottom surface of the cavity. As described herein, the entire interior surface of the cavity may act as a common grounding surface for any cavity resonance within the cavity, EMI, and unintended ground couplings within the cavity.

The method 500 may include, at block 515, operating the audio speaker within the cavity to emit audio therefrom to produce sound through a speaker grill of the cavity and co-located with the antenna element to selectively emit audio and the communications signal from the same cavity. The operation of the audio speaker may include providing electrical signals from an audio driver under the execution of computer readable program code by a processor. The cavity may include a speaker cavity insert that provides an amount of volume within the cavity to provide an acoustic back volume so that the audio waves may pass through openings formed in the speaker grill. At this point, the method 500 may end.

Figure 6:
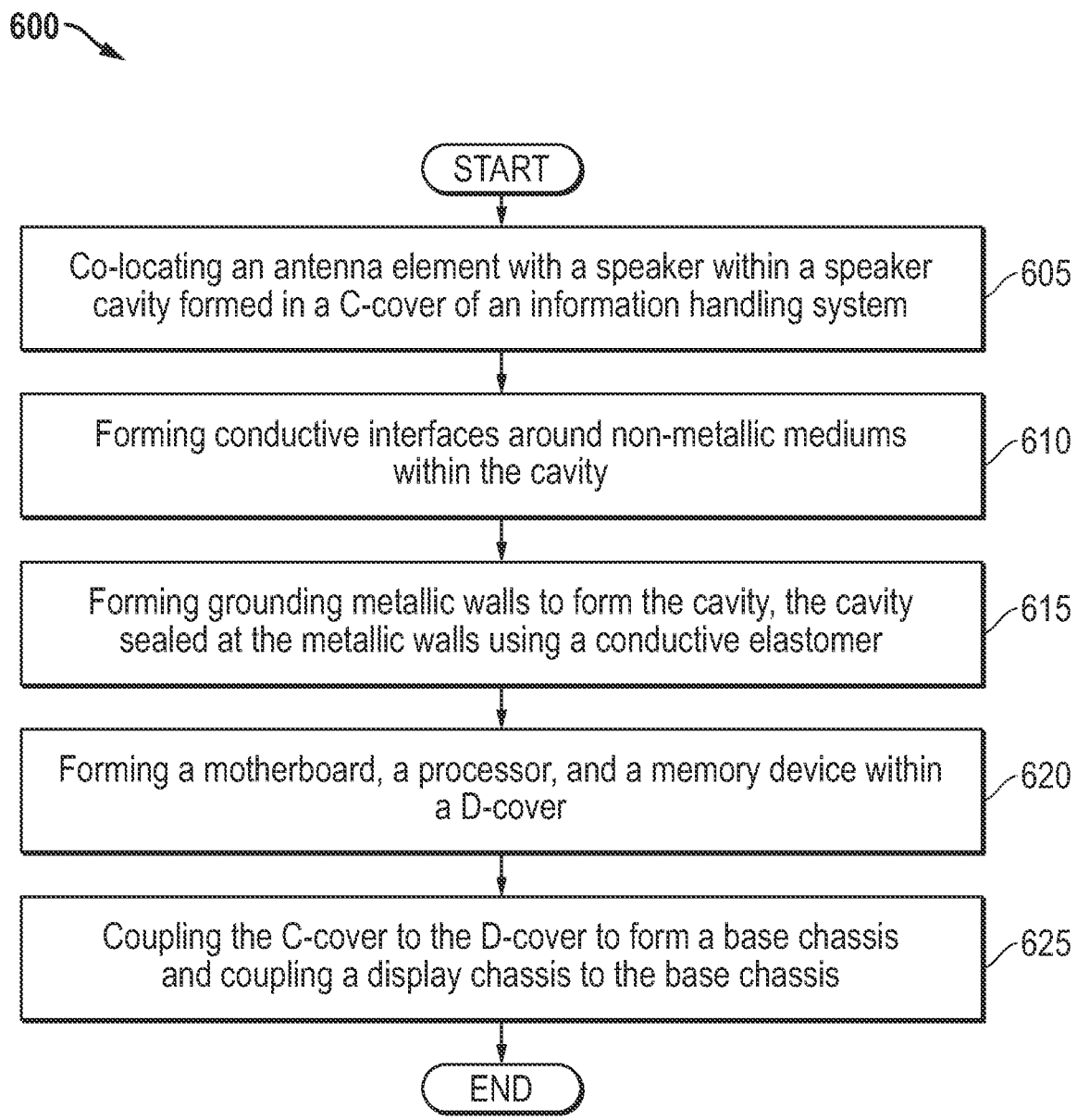
FIG. 6 is a flow diagram illustrating a method of assembling an information handling system according to an embodiment of the present disclosure.

FIG. 6 is a flow diagram illustrating a method 600 of assembling an information handling system according to an embodiment of the present disclosure. The method 600 may include, at block 605, co-locating an antenna element within a speaker cavity. In an embodiment, the antenna element may be placed parallel with the speaker allowing the antenna element to interface with a slot formed around the speaker grill. As described herein, the slot may resonate through the use of the antenna element. In another embodiment, the antenna may resonate within the cavity creating a resonant frequency that is emitted from the speaker grill. In an embodiment, an electromagnetic induction (EMI) isolation wall may be formed around the speaker grill and speaker. As described herein, the EMI isolation wall may be formed on the C-cover and extend to the D-cover. In an embodiment, the EMI isolation wall may be formed on the D-cover and extend to the C-cover.

The method 600 includes forming, at block 610, conductive interfaces around non-metallic mediums within the cavity. The conductive interfaces may include any metallic overlay that may serve as a grounding surface to ground cavity resonance modes, errant EMI, and unintended ground current coupling. In an embodiment, the metallic overlay and metallic walls may be electrically coupled to the common grounding plane. In an embodiment, a plastic audio insert may be placed within the cavity with some or all of the surfaces of the plastic audio insert being overlaid with a metallic overlay.

The method 600 may further include, at block 615, forming grounding metallic walls to form the cavity, the cavity sealed at the metallic walls using a conductive elastomer. The conductive elastomer may be one of many example conductive materials that may electrically (and acoustically) seal the cavity so that the EMI may be grounded within the cavity. Still further, the conductive material may acoustically seal the cavity to increase the ability of the speaker to propagate audio waves.

In an embodiment, the method 600 of assembling the information handling system may further include placing an audio speaker within the cavity and placing the antenna element at a location where the activation of the transducer of the speaker cannot interfere with the transmission of the RF EM waves from the antenna element. In an embodiment, the placement of the speaker at block 615 may be conducted prior to the insertion of the plastic audio insert into the cavity.

The method 600 may, at block 620, include forming a motherboard, a processor, and a memory device into the D-cover. Other components of the information handling system may also be placed and secured into the D-cover that adds certain functionalities to the information handling system such as a keyboard, a track pad, other input devices, among others. In an alternative embodiment, the mother board, the processor, and the memory device may be placed within and secured to the C-cover.

The method 600 may also include, at block 625, coupling the C-cover to the D-cover to form a base chassis as well as coupling a display chassis to the base chassis. The display chassis may be coupled to the base chassis via a hinge so as to allow the base chassis to be rotated away from the display chassis. At this point, the method 600 may end.

The blocks of flow diagram of FIGS. 5 and 6 discussed above need not be performed in any given or specified order. It is contemplated that additional blocks, steps, or functions may be added, some blocks, steps or functions may not be performed, blocks, steps, or functions may occur contemporaneously, and blocks, steps or functions from one flow diagram may be performed within another flow diagram.

Although only a few exemplary embodiments have been described in detail herein, those skilled in the art will readily appreciate that many modifications are possible in the exemplary embodiments without materially departing from the novel teachings and advantages of the embodiments of the present disclosure. Accordingly, all such modifications are intended to be included within the scope of the embodiments of the present disclosure as defined in the following claims. In the claims, means-plus-function clauses are intended to cover the structures described herein as performing the recited function and not only structural equivalents, but also equivalent structures.

The above-disclosed subject matter is to be considered illustrative, and not restrictive, and the appended claims are intended to cover any and all such modifications, enhancements, and other embodiments that fall within the scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. An information handling system to wirelessly transmit and receive data comprising:
    a base chassis including a metal C-cover and metal D-cover to house a processor, a memory, and a wireless adapter;
    a speaker grill covering a speaker to emit audio waves;
    the speaker grill formed within the C-cover to emit a target radio frequency (RF) including a slot formed around a portion of the speaker grill forming a peninsula on the speaker grill to physically separate the peninsula from the C-cover;
    an antenna element placed behind the speaker grill and operatively coupled to the wireless adapter; and
    an electromagnetic interference (EMI) shield forming a cavity enclosing the speaker and the antenna element under the speaker grill.

2. The information handling system of claim 1 further comprising:
    a plastic audio insert formed within the cavity wherein a portion of the plastic audio insert comprises a metallic overlay forming a portion of the EMI shield.

3. The information handling system of claim 1, wherein the EMI shield forming the cavity enclosing the speaker and the antenna element under the speaker grill includes a plurality of metallic walls.

4. The information handling system of claim 3, wherein the plurality of metallic walls further includes conductive gasket to extend the plurality of metallic walls to a grounding source in the C-cover or D-cover.

5. The information handling system of claim 1 further comprising:
    a foam rib placed between the D-cover and the speaker to maintain the speaker in a position above the D-cover.

6. The information handling system of claim 1, comprising a plurality of plastic speaker arms extending from the C-cover in the cavity to maintain the speaker a distance away from the speaker grill and D-cover.

7. The information handling system of claim 1, wherein the D-cover forms one of the plurality of metallic walls of the EMI shield.

8. The information handling system of claim 1, wherein a portion of the EMI shield includes an metallic foil layer placed over non-metallic plastic audio insert placed within the cavity, and the metallic foil layer is electrically coupled to a grounding source.

9. A C-cover and D-cover assembly for an information handling system comprising:
    a metal C-cover having a speaker grill formed thereon including a slot formed through the C-cover around a portion of the speaker grill forming a peninsula of the speaker grill to operate as an antenna with an antenna element placed under the speaker grill;
    the speaker grill covering a speaker to emit audio waves;
    an electromagnetic interference (EMI) shield forming a cavity to house the antenna element and speaker the EMI shield extending from the C-cover to the D-cover.

10. The assembly of claim 9 further comprising:
    a plurality of metallic shielding walls forming the EMI shield extending from the C-cover to the D-cover.

11. The assembly of claim 10 further comprising:
    a conductive rubber gasket placed between at least one of the plurality of metallic walls and the D-cover to shield the cavity from EMI sources and seal the cavity to audio waves produced by the speaker.

12. The assembly of claim 9 wherein a plurality of metallic walls and conductive rubber gasket form the EMI shield and extend a grounding plane to a grounding source within the cavity.

13. The assembly of claim 9 further comprising:
    a plastic audio insert formed within the cavity wherein a portion of the plastic audio insert includes a metallic overlay forming a portion of the EMI shield.

14. The assembly of claim 9 further comprising:
    a speaker arm extending from the C-cover in the cavity to mount the speaker under the speaker grill.

15. The assembly of claim 9, wherein the slot formed around a portion of the speaker grill is capacitively coupled to the antenna element to emit an RF EM signal from a portion of the slot of the speaker grill.

16. An information handling system to transmit a communication signal comprising:
    a metal C-cover and a metal D-cover assembly including a processor, a memory, and a wireless adapter;
    a speaker grill formed in the C-cover to cover a speaker and an antenna element;
    a slot formed through the metal C-cover around a portion of the speaker grill forming a peninsula of the speaker grill; and
    a plurality of electromagnetic isolation (EMI) shielding walls placed around the perimeter of the speaker grill to form a cavity behind the speaker grill to house the speaker and the antenna element, where the EMI shielding walls extend from the C-cover to a D-cover of the information handling system.

17. The information handling system of claim 16 further comprising:

a plastic audio insert formed within the cavity wherein a portion of the plastic audio insert comprises a metallic overlay forming at least one EMI shielding wall.

18. The information handling system of claim 16, wherein the EMI shielding walls include a conductive rubber gasket placed between at least one of the EMI shielding walls and the D-cover to shield the cavity from EMI sources.

19. The information handling system of claim 16 further comprising:

a plastic speaker arm extending from the C-cover to mount the speaker under the speaker grill and away from the D-cover.

20. The information handling system of claim 16, wherein at least one EMI shielding wall includes a metallic overlay that is a metallic foil.

* * * * *